(12) United States Patent
Choe et al.

(10) Patent No.: US 9,324,913 B2
(45) Date of Patent: *Apr. 26, 2016

(54) NITRIDE SEMICONDUCTOR STRUCTURE, MULTILAYER STRUCTURE, AND NITRIDE SEMICONDUCTOR LIGHT-EMITTING ELEMENT

(71) Applicant: Panasonic Corporation, Osaka (JP)

(72) Inventors: Songbaek Choe, Osaka (JP); Shunji Yoshida, Kanagawa (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/293,441

(22) Filed: Jun. 2, 2014

(65) Prior Publication Data

US 2014/0269801 A1   Sep. 18, 2014

Related U.S. Application Data

(63) Continuation of application No. PCT/JP2013/005887, filed on Oct. 2, 2013.

(30) Foreign Application Priority Data

Oct. 5, 2012   (JP) .................................. 2012-223035

(51) Int. Cl.
*H01L 33/32* (2010.01)
*C30B 25/04* (2006.01)
(Continued)

(52) U.S. Cl.
CPC ................ *H01L 33/32* (2013.01); *C30B 25/04* (2013.01); *C30B 25/183* (2013.01); *C30B 25/186* (2013.01); *C30B 29/403* (2013.01);
(Continued)

(58) Field of Classification Search
None
See application file for complete search history.

(56) References Cited

U.S. PATENT DOCUMENTS 6,265,089 B1 * 7/2001 Fatemi et al. ................. 428/698
8,409,892 B2 * 4/2013 Peng .................... H01L 21/0242
257/E21.113

(Continued)

FOREIGN PATENT DOCUMENTS

JP    2001-308462 A    11/2001
JP    2003-332697 A    11/2003

(Continued)

OTHER PUBLICATIONS

International Search Report for corresponding International Application No. PCT/JP2013/005887 mailed Jan. 7, 2014.

(Continued)

*Primary Examiner* — William Coleman
*Assistant Examiner* — Kien Ly
(74) *Attorney, Agent, or Firm* — Renner, Otto, Boisselle & Sklar, LLP

(57) ABSTRACT

A nitride semiconductor structure includes: a plurality of crystal growth seed regions formed of a nitride semiconductor, of which the principal surface is an m-plane and which extends to a range that defines an angle of not less than 0 degrees and not more than 10 degrees with respect to an a-axis; and a laterally grown region formed of a nitride semiconductor which has extended in a c-axis direction from each of the plurality of crystal growth seed regions. An S width that is the spacing between adjacent ones of the plurality of crystal growth seed regions is at least 20 μm.

5 Claims, 15 Drawing Sheets

(51) Int. Cl.
*C30B 29/40* (2006.01)
*C30B 29/36* (2006.01)
*H01L 21/02* (2006.01)
*H01L 33/06* (2010.01)
*C30B 25/18* (2006.01)
*C30B 29/68* (2006.01)
*H01L 33/00* (2010.01)
*H01L 33/16* (2010.01)
*H01L 33/02* (2010.01)
*H01S 5/343* (2006.01)

(52) U.S. Cl.
CPC ............. *C30B29/406* (2013.01); *C30B 29/68* (2013.01); *H01L 21/0242* (2013.01); *H01L 21/0254* (2013.01); *H01L 21/0262* (2013.01); *H01L 21/0265* (2013.01); *H01L 21/02433* (2013.01); *H01L 21/02458* (2013.01); *H01L 21/02576* (2013.01); *H01L 21/02579* (2013.01); *H01L 21/02642* (2013.01); *H01L 33/06* (2013.01); *H01L 33/007* (2013.01); *H01L 33/16* (2013.01); *H01S 5/34333* (2013.01); *H01S 2304/12* (2013.01)

(56) References Cited

U.S. PATENT DOCUMENTS

| | | | |
|---|---|---|---|
| 8,928,004 B2* | 1/2015 | Choe | C30B 25/04 257/76 |
| 2002/0028564 A1* | 3/2002 | Motoki | C30B 25/02 438/460 |
| 2003/0119239 A1* | 6/2003 | Koike | H01L 33/007 438/200 |
| 2003/0207125 A1 | 11/2003 | Sunakawa et al. | |
| 2006/0084245 A1 | 4/2006 | Kohda | |
| 2007/0059852 A1 | 3/2007 | Miyachi et al. | |
| 2007/0164269 A1* | 7/2007 | Okuyama | C30B 25/02 257/13 |
| 2008/0163814 A1 | 7/2008 | Kim et al. | |
| 2010/0207136 A1 | 8/2010 | Armitage et al. | |
| 2010/0244063 A1 | 9/2010 | Yokogawa et al. | |
| 2010/0308437 A1 | 12/2010 | Okuno et al. | |
| 2012/0000415 A1* | 1/2012 | D'Evelyn | C30B 25/02 117/94 |
| 2012/0001223 A1 | 1/2012 | Inoue et al. | |
| 2012/0068192 A1 | 3/2012 | Kim et al. | |
| 2012/0091463 A1* | 4/2012 | Yokogawa | H01L 21/0237 257/76 |

FOREIGN PATENT DOCUMENTS

| | | |
|---|---|---|
| JP | 2005-327821 A | 11/2005 |
| JP | 2006-019763 A | 1/2006 |
| JP | 2007-184503 A | 7/2007 |
| JP | 2008-501606 A | 1/2008 |
| JP | 2010-512301 T | 4/2010 |
| WO | WO 03/089696 A1 | 10/2003 |
| WO | WO 2005/122267 A2 | 12/2005 |
| WO | WO 2006/130623 A2 | 12/2006 |
| WO | WO 2008/047907 A1 | 4/2008 |
| WO | WO 2010/029720 A1 | 3/2010 |
| WO | WO 2011/083551 A1 | 7/2011 |

OTHER PUBLICATIONS

Form PCT/ISA/237 for corresponding International Application No. PCT/JP2013/005887 dated Jan. 7, 2014.
Hirai et al., "Formation and reduction of pyramidal hillocks on $m$-plane {1100} GaN", Applied Physics Letters 91, 191906 (2007).
Baker et al., "Characterization of Planar Semipolar Gallium Nitride Films on Sapphire Substrates", Japanese Journal of Applied Physics, vol. 45, No. 6, 2006, p. L154-157.
Young et al., "Lattice Tilt and Misfit Dislocations in (1122) Semipolar GaN Heteroepitaxy", Applied Physics Express 3, 011004 (2010).
Yoshida et al., "Evidence of lattice tilt and slip in m-plane InGaN/GaN heterostructure", Applied Physics Letters 99, 131909 (2011).
Narayan et al., "Domain epitaxy: A unified paradigm for thin film growth", Journal of Applied Physics, vol. 93, No. 1, Jan. 1, 2003.
Zhao et al., "Indium incorporation and emission properties of nonpolar and semipolar InGaN quantum wells", Applied Physics Letters, 100, 201108 (2012).
Chen et al., "Dislocation reduction in GaN thin films via lateral overgrowth from trenches", Applied Physics Letters, vol. 75, No. 14, Oct. 4, 1999.
Kidoguichi et al., "Air-bridged lateral epitaxial overgrowth of GaN thin films", Applied Physics Letters, vol. 76, No. 25, Jun. 19, 2000.

\* cited by examiner

FIG.1
CONVENTIONAL ART
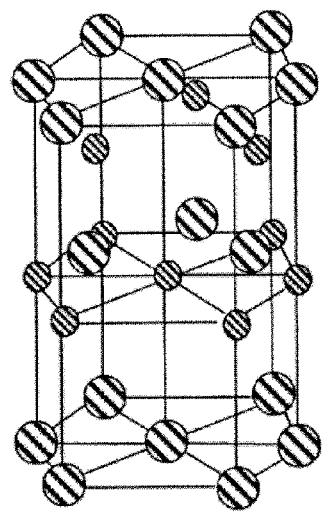
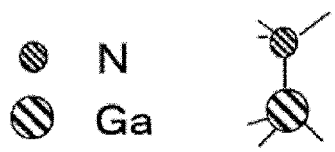
FIG.2
CONVENTIONAL ART
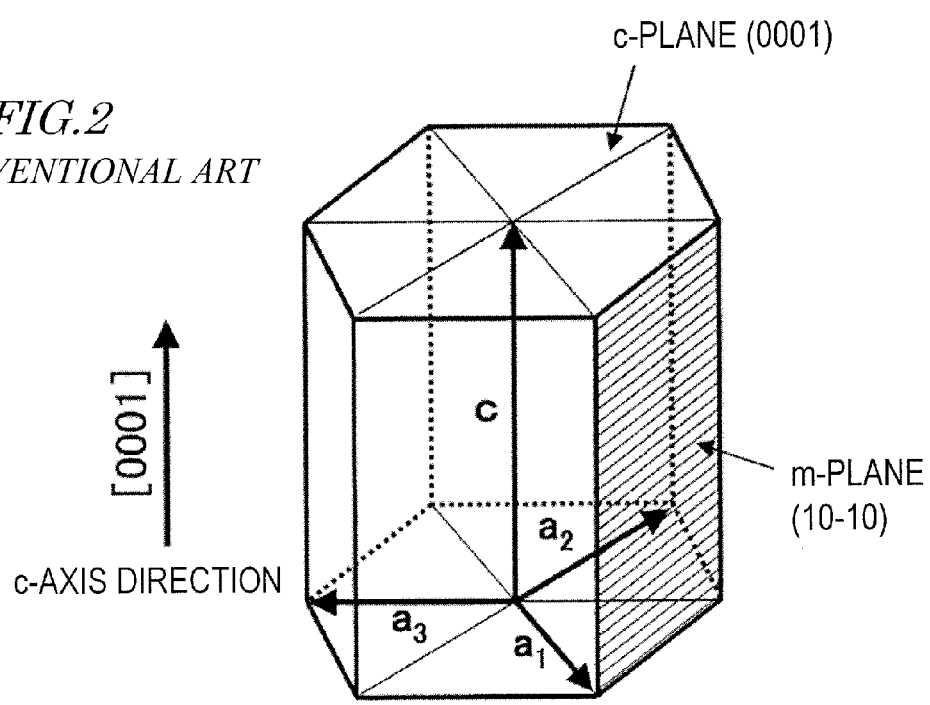

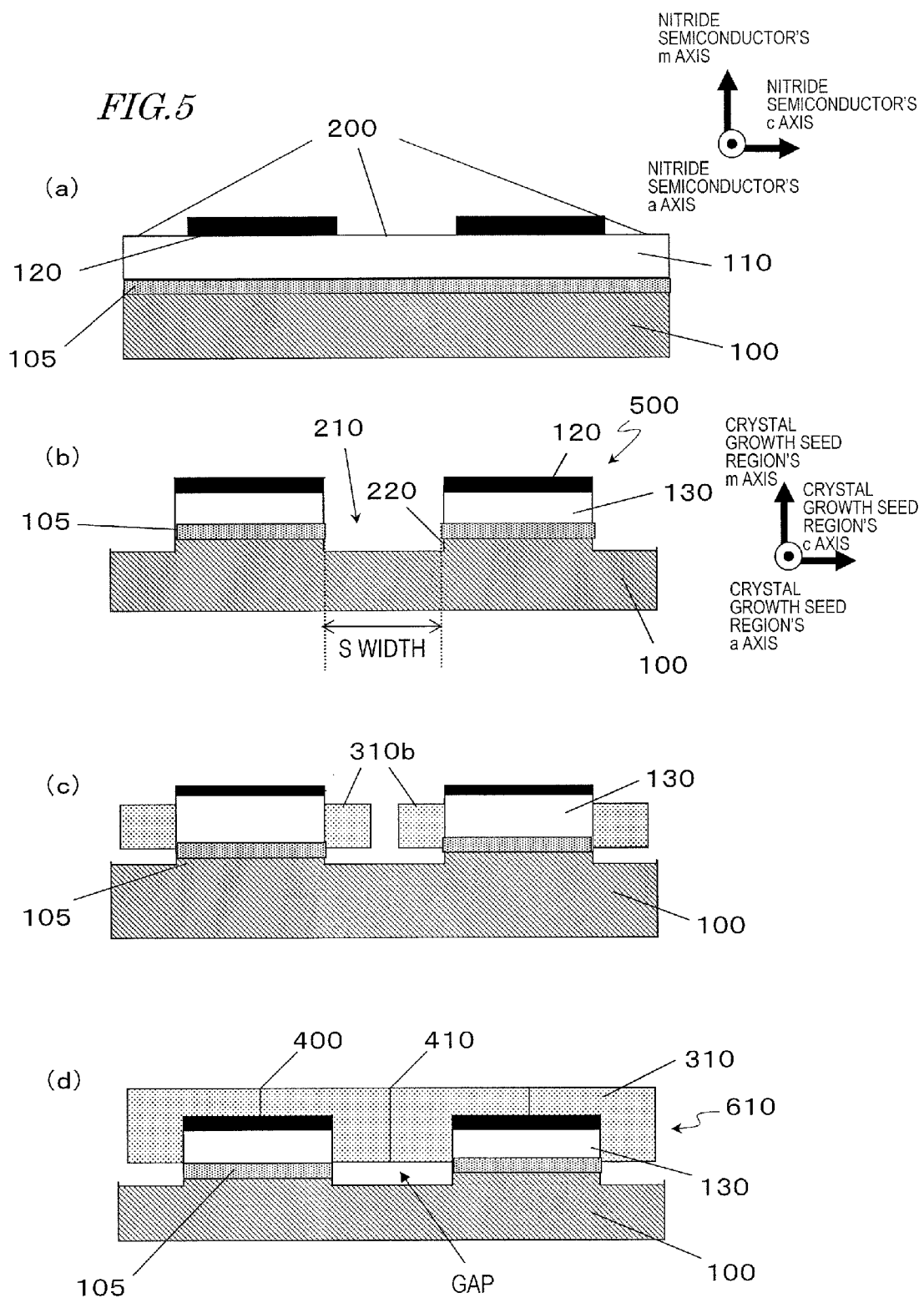

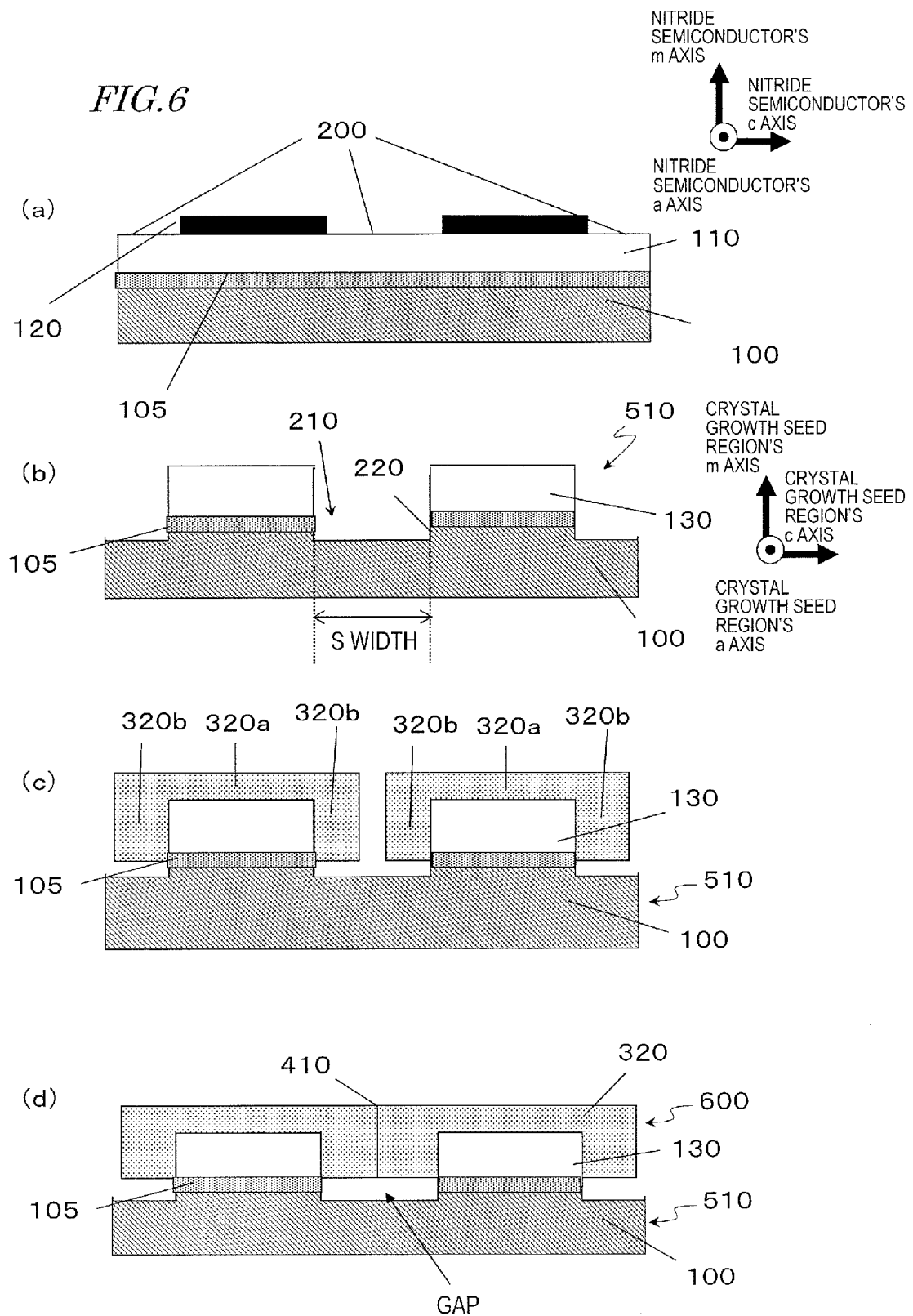

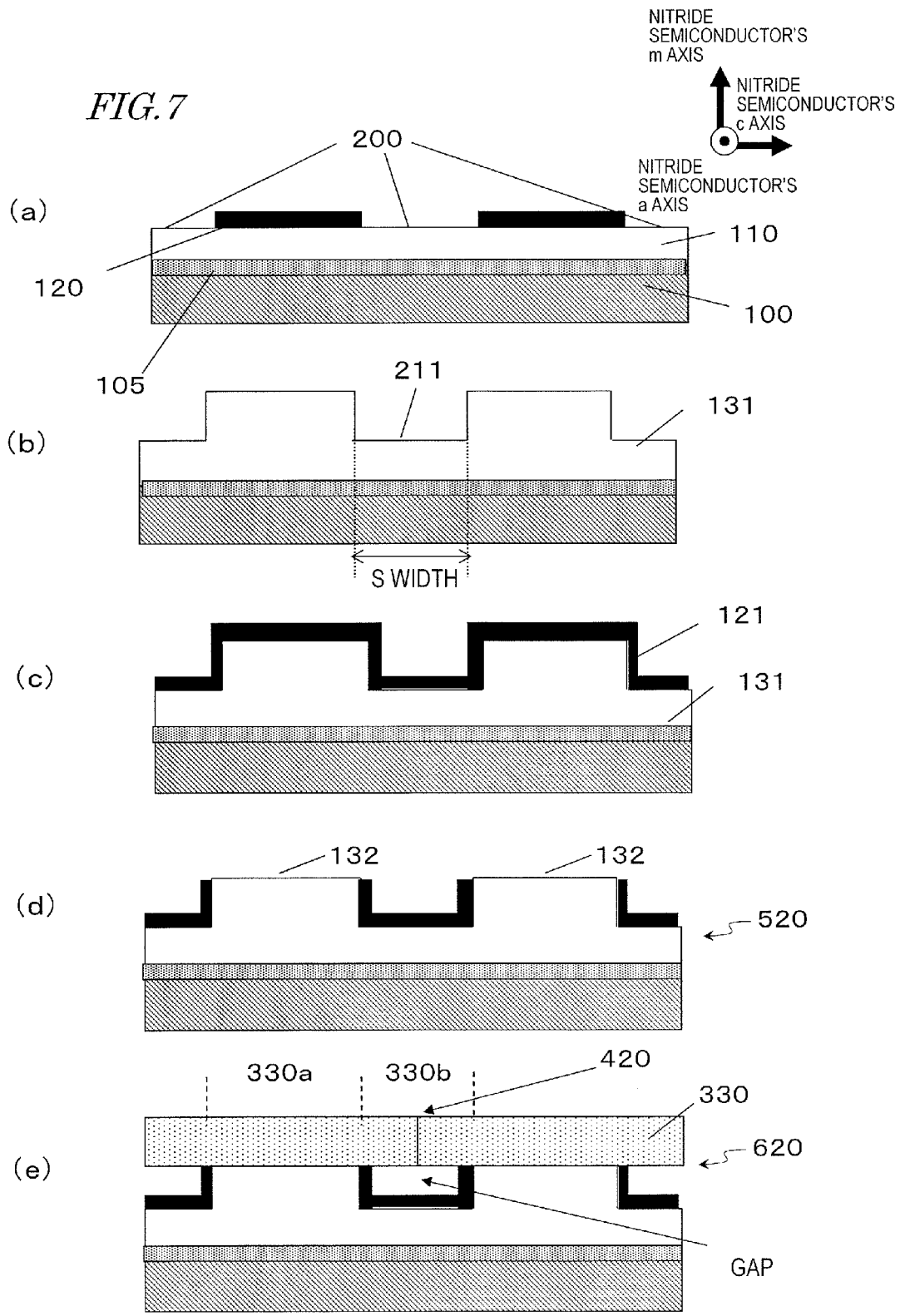

FIG.9
(a)
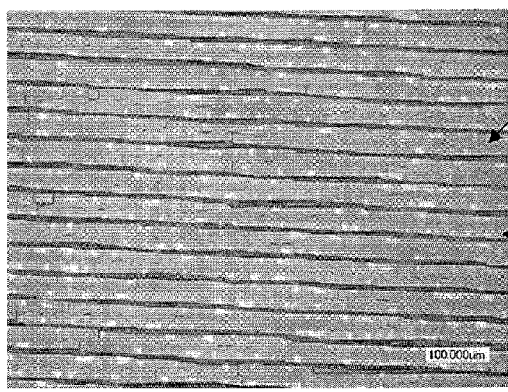
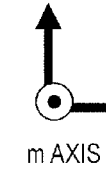
GaN'S c AXIS
SAPPHIRE'S a AXIS
GaN'S a AXIS
SAPPHIRE'S c AXIS
m AXIS
320
210
(b)
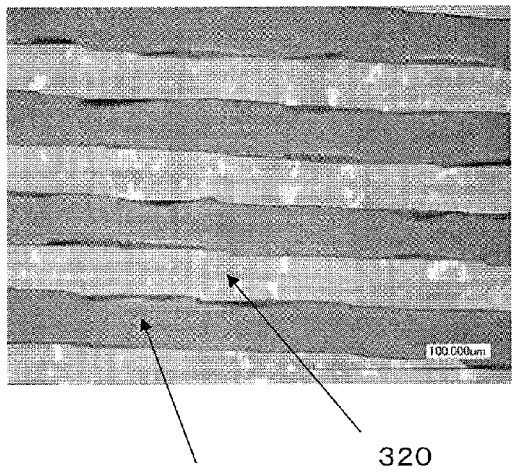
320
210
(c)
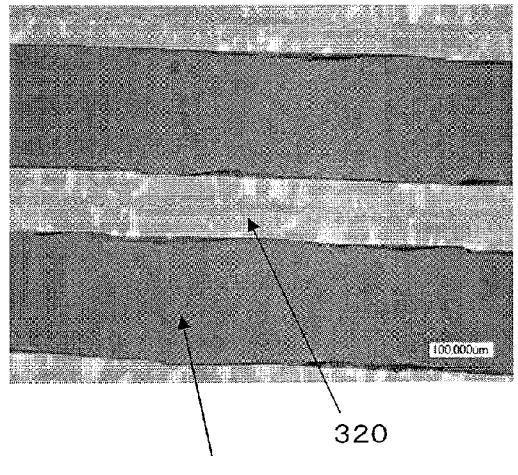
320
210

GaN's a-AXIS DIRECTION
(PARALLEL TO STRIPES)

GaN c-axis

GaN a-axis m

GaN's c-AXIS DIRECTION
(PERPENDICULAR TO STRIPES)

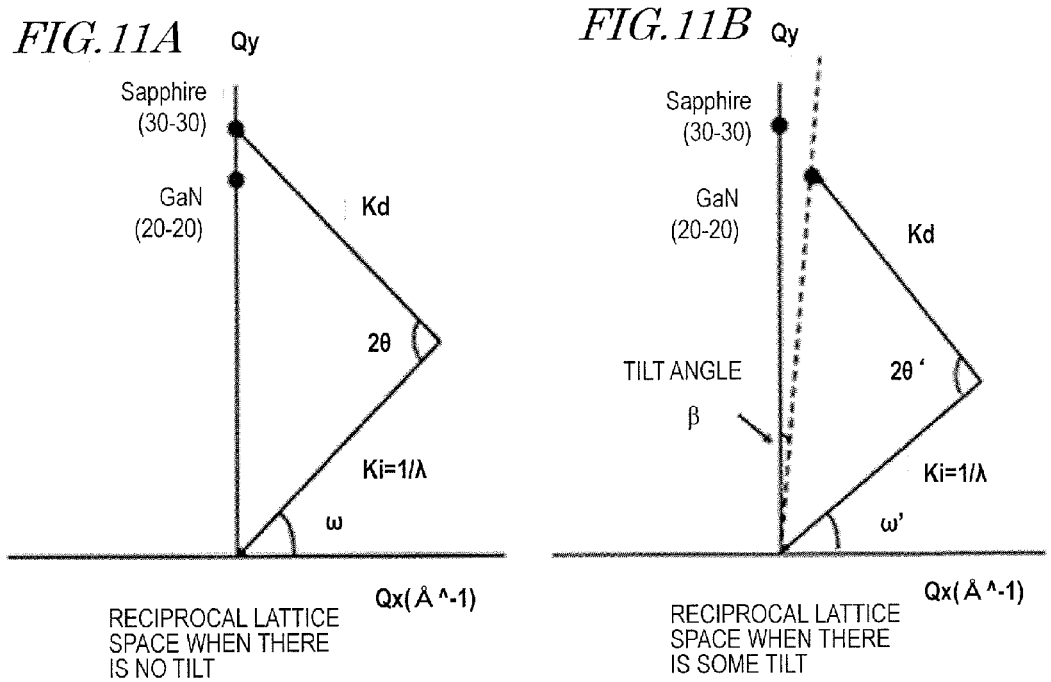
FIG. 11A Reciprocal lattice space when there is no tilt
FIG. 11B Reciprocal lattice space when there is some tilt
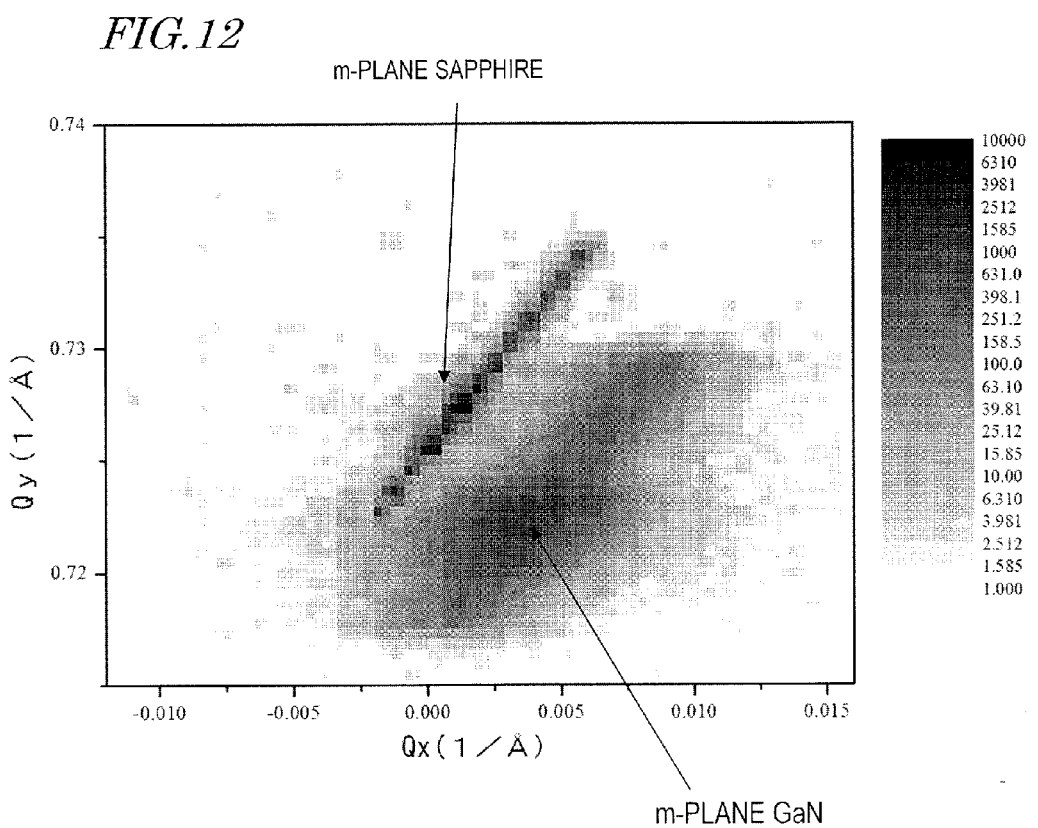
FIG. 12

FIG.13
(a) COMPARATIVE EXAMPLE 1 WITH NO LATERALLY GROWN REGIONS
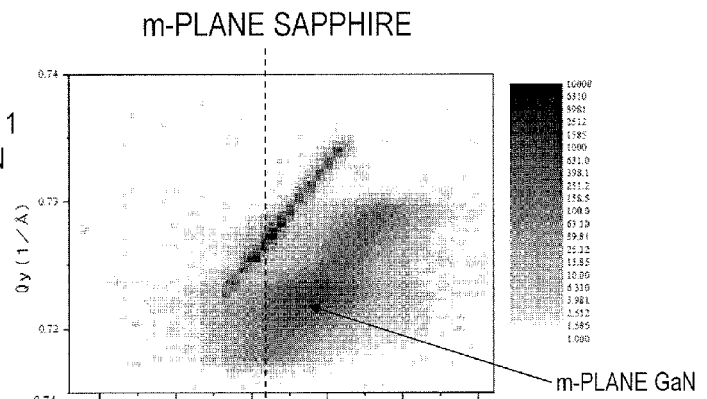
(b) COMPARATIVE EXAMPLE 2 IN WHICH S WIDTH = 10 μm
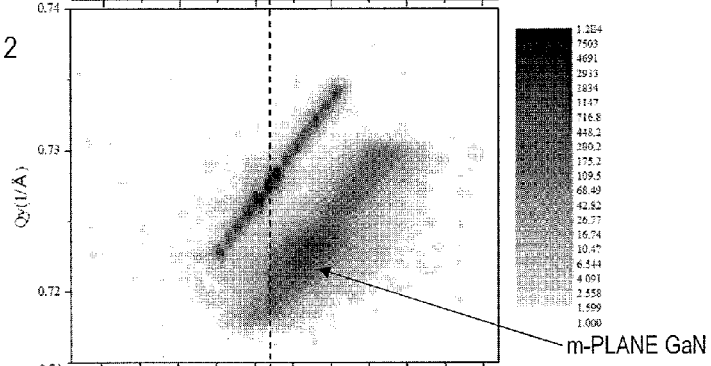
(c) EXAMPLE 1 IN WHICH S WIDTH = 50 μm
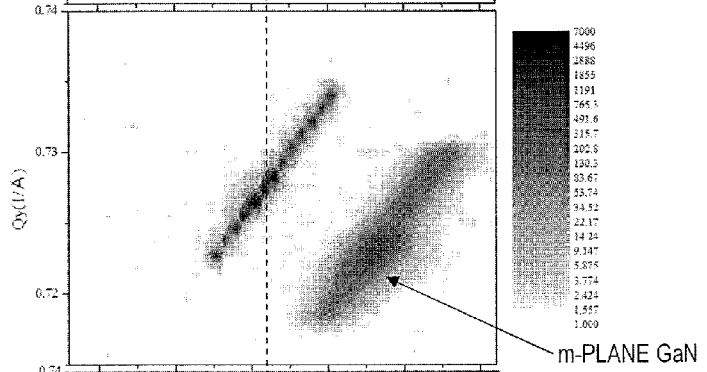
(d) EXAMPLE 2 IN WHICH S WIDTH = 100 μm
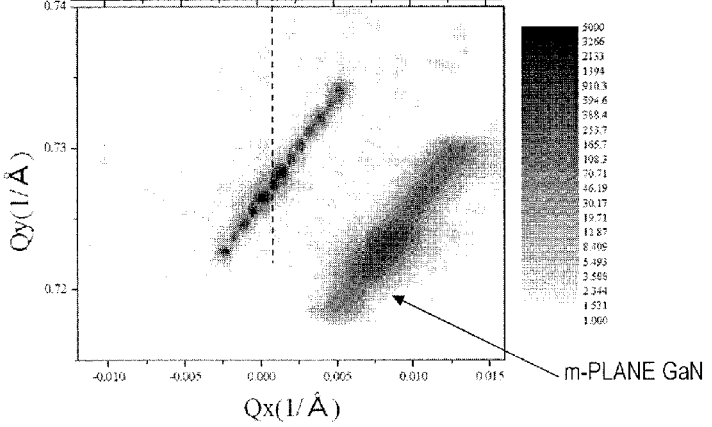

NITRIDE SEMICONDUCTOR STRUCTURE, MULTILAYER STRUCTURE, AND NITRIDE SEMICONDUCTOR LIGHT-EMITTING ELEMENT

This is a continuation of International Application No. PCT/JP2013/005887, with an international filing date of Oct. 2, 2013, which claims priority of Japanese Patent Application No. 2012-223035, filed on Oct. 5, 2012, the contents of which are hereby incorporated by reference.

BACKGROUND

1. Technical Field

The present disclosure relates to a structure to grow nitride semiconductor layers, a multilayer structure including such a structure, a nitride based semiconductor element including such a multilayer structure, a light source including such a nitride based semiconductor element, and methods of making them.

2. Description of the Related Art

A nitride semiconductor including nitrogen (N) as a Group V element is a prime candidate for a material to make a light-emitting element operating in the deep ultraviolet (200 nm) to visible radiation (approximately 650 nm) wavelength range, because its bandgap is variable in a wide energy range. Among other things, gallium nitride-based compound semiconductors (which will be referred to herein as "GaN-based semiconductors") have been researched and developed particularly extensively. As a result, blue-ray-emitting light-emitting diodes (LEDs), green-ray-emitting LEDs and semiconductor laser diodes formed of GaN-based semiconductors have already been used in actual products (see Japanese Laid-Open Patent Publications No. 2001-308462 and No. 2003-332697, for example).

A GaN-based semiconductor includes an $Al_xGa_yIn_zN$ (where $0 \leq x, z<1$, $0<y \leq 1$ and $x+y+z=1$) semiconductor and has a wurtzite crystal structure. FIG. 1 schematically illustrates a unit cell of GaN. In an $Al_xGa_yIn_zN$ (where $0 \leq x, z<1$, $0<y \leq 1$ and $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to herein as "C-axis" and "C-plane". In the accompanying drawings, those axes and planes are identified by the small letter.

In fabricating a semiconductor element using GaN-based semiconductors, a c-plane substrate, i.e., a substrate of which the principal surface is a (0001) plane, is generally used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane".

There are two types of electrical polarizations, namely, spontaneous polarization and piezoelectric polarization. Among other things, the piezoelectric polarization is strongly correlated to strain in a crystal. For example, in an InGaN well layer over a GaN layer, the larger the In composition is, the greater the magnitude of the strain is and the greater the magnitude of the electrical polarization is. As a result of the electrical polarization, an internal electric field is generated in the InGaN quantum well of the active layer in the c-axis direction. Once such a piezoelectric field has been generated in the active layer, some positional deviation occurs in the distributions of electrons and holes in the active layer due to the quantum confinement Stark effect of carriers. Consequently, the internal quantum efficiency decreases, thus increasing the threshold current in a semiconductor laser diode and increasing the power dissipation and decreasing the luminous efficiency in an LED. Meanwhile, as the density of injected carriers increases, the piezoelectric field is screened, thus varying the emission wavelength, too.

Thus, to overcome these problems, it has been proposed that a substrate, of which the principal surface is a non-polar plane such as a (1-100) plane that is perpendicular to the [1-100] direction and that is called an "m-plane", be used. An LED, of which the principal surface is such a non-polar plane, for example, could increase the luminous efficiency more significantly than a conventional LED, of which the principal surface is a c-plane.

In this description, "-" attached on the left-hand side of a Miller-Bravais index in the parentheses means a "bar" (a negative direction index). As shown in FIG. 2, the m-plane is parallel to the c-axis (i.e., the primitive vector c) and intersects with the c-plane at right angles. On the m-plane, Ga atoms and nitrogen atoms are on the same atomic plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above. In this case, the "m-plane" is a generic term that collectively refers to a family of planes including (1-100), (-1010), (10-10), (-1100), (01-10) and (0-110) planes.

Also, in this description, the "X-plane growth" means epitaxial growth that is produced perpendicularly to the X plane (where X=c or m) of a hexagonal wurtzite structure. As for the X-plane growth, the X plane will be sometimes referred to herein as a "principal surface" or a "growing plane". Furthermore, a layer of semiconductor crystals that have been formed as a result of the X-plane growth will be sometimes referred to herein as an "X-plane semiconductor layer".

LEDs and laser diodes that use a nitride semiconductor structure, of which the principal surface is an m-plane that is a non-polar plane, have already been realized in laboratories as a result of recent researches and developments. In most of those researches, a GaN bulk substrate, of which the principal surface is an m-plane, is used as a growing substrate. That is why a nitride semiconductor element structure can be grown to have excellent crystal quality without causing a lattice mismatch or a difference in thermal expansion coefficient between the growing layers and the substrate, and high-efficiency LED and laser oscillation has been achieved.

SUMMARY

As described above, by making a light-emitting element (such as an LED or a laser diode) based on a nitride semiconductor structure, of which the principal surface is a non-polar plane, a decrease in transition probability due to generation of an internal electric field can be prevented and the performance of the device is improved in terms of efficiency and lifetime compared to a conventional light-emitting element, of which the principal surface is a c-plane (that is a polar plane).

When a crystal-growing process is carried out to make a nitride semiconductor element, of which the principal surface is an m-plane, a GaN bulk wafer is used currently. However, a GaN bulk wafer is more expensive, and harder to increase its diagonal size, than a sapphire wafer for use in a c-plane GaN-based LED. On the other hand, a sapphire wafer having a diagonal size of 2 inches is as cheap as a few thousand yen and a sapphire wafer of as large a size as six inches or more has already been realized. Thus, if a sapphire wafer could be used to grow nitride semiconductor crystals on an m-plane that is a non-polar plane, it would be effective particularly in terms of cutting down the cost. For example, if a sapphire wafer, of which the principal surface is an m-plane (and which will be referred to herein as an "m-plane sapphire wafer"), is used to grow nitride semiconductor crystals thereon, m-plane nitride semiconductors can be grown (see PCT International Application Publication No. 2008/047907). In addition, on an m-plane sapphire wafer, (11-22) and (10-1-3) planes, which are semi-polar planes, can also be formed (see Japanese Journal of Applied Physics 45, No. 6, L154-L157 (2006)).

However, since a sapphire wafer is different from nitride semiconductor crystals in terms of their crystal structure, lattice constant and thermal expansion coefficient, nitride semiconductor crystals grown on a sapphire wafer have imperfections and dislocations at high densities. A dislocation is a defect which has been caused as a line defect due to a mismatch between crystal lattices. Those imperfections and dislocations are caused chiefly due to a lattice mismatch between the sapphire wafer and the nitride semiconductor crystals, and the difference in their crystal structure. Those imperfections that have been caused in the interface between the sapphire wafer and the nitride semiconductor crystals will reach the active layer in the nitride semiconductor crystals or the surface of the element, thus deteriorating the performance of the device significantly (e.g., decreasing the efficiency of the LED or shortening its lifetime).

A nonlimiting exemplary embodiment of the present disclosure provides a nitride semiconductor structure of which the nitride semiconductor crystals have had their strain relaxed, and eventually had their crystal quality improved, by producing dislocations purposely in those nitride semiconductor crystals having the principal surface which is a non-polar plane that has been formed on a hetero substrate by epitaxial growth (i.e., by hetero-epitaxial growth).

In one general aspect, a nitride semiconductor structure includes: a plurality of crystal growth seed regions formed of a nitride semiconductor, of which the principal surface is an m-plane and which extends to a range that defines an angle of not less than 0 degrees and not more than 10 degrees with respect to an a-axis; and a laterally grown region formed of a nitride semiconductor which has extended in a c-axis direction from each of the plurality of crystal growth seed regions. An S width that is the spacing between adjacent ones of the plurality of crystal growth seed regions is at least 20 μm. By adopting this configuration, the lattice strain in the laterally grown region can be relaxed and a nitride semiconductor with reduced strain can be obtained.

According to the above aspect, in a non-polar-plane nitride semiconductor that has been formed on a hetero substrate, the internal strain of the nitride semiconductor can be relaxed so significantly that a novel nitride semiconductor structure with improved crystallinity is provided.

These general and specific aspects may be implemented using a method. Additional benefits and advantages of the disclosed embodiments will be apparent from the specification and FIGS. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 1 is a perspective view schematically illustrating a unit cell of GaN.

FIG. 2 is a perspective view showing the primitive vectors $a_1$, $a_2$, $a_3$ and c of a wurtzite crystal structure.

Portions (a) to (d) of FIG. 5 are cross-sectional views illustrating respective process steps of a lateral selective growth process by the masked Pendeo method.

Portions (a) to (d) of FIG. 6 are cross-sectional views illustrating respective process steps of a lateral selective growth process by the maskless Pendeo method.

Portions (a) to (e) of FIG. 7 are cross-sectional views illustrating respective process steps of a lateral selective growth process by the ABLEG method.

Figure 8:
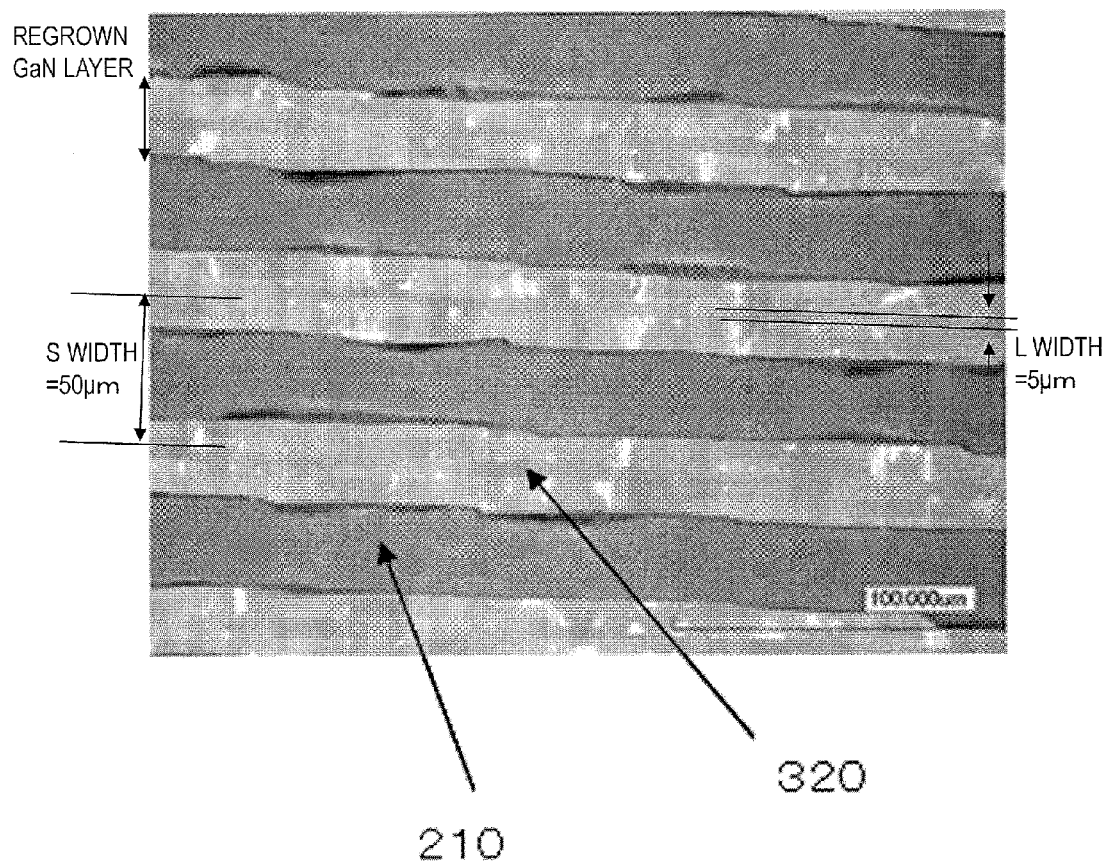

FIG. 8 is a surface micrograph according to Example 1.

Portions (a) to (c) of FIG. 9 are surface micrographs of hetero-nitride semiconductor substrates 600 with mutually different S widths, wherein portion (a) shows Comparative Example 2 in which the L and S widths were set to be 5 μm and 10 μm, respectively, portion (b) shows Example 1 in which the L and S widths were set to be 5 μm and 50 μm, respectively, and portion (c) shows Example 2 in which the L and S widths were set to be 5 μm and 100 μm, respectively.

Figure 10A:
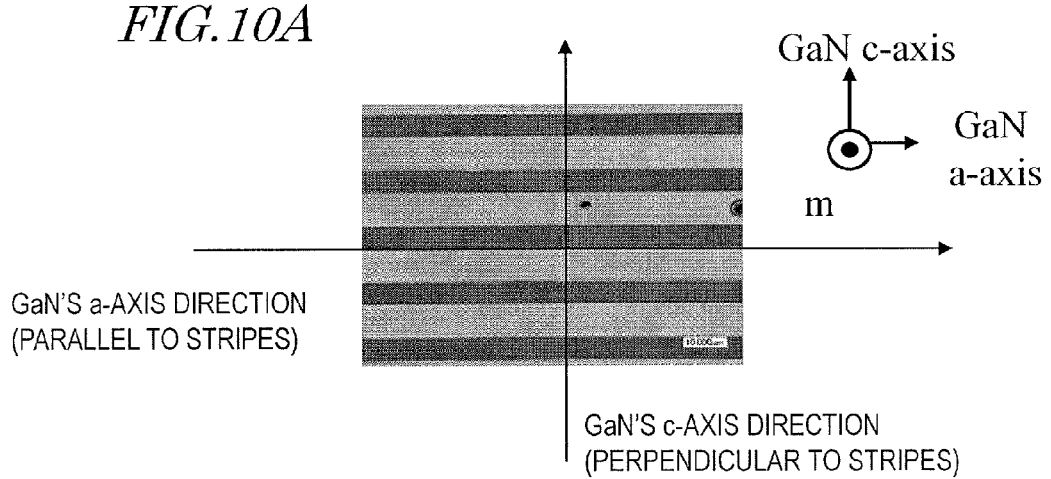
Figure 10B:
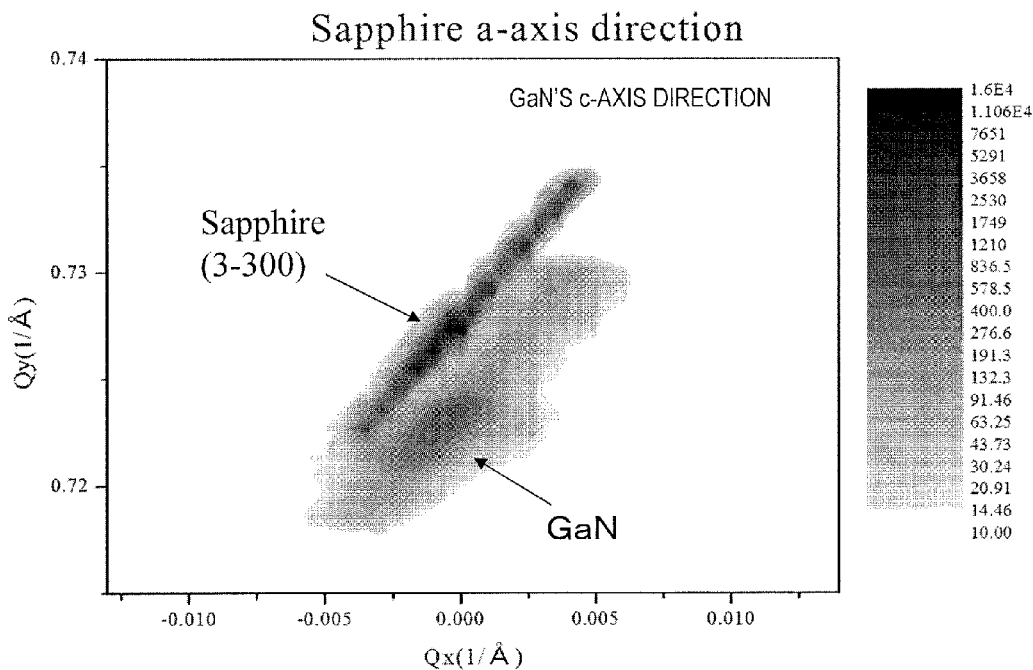
Figure 10C:
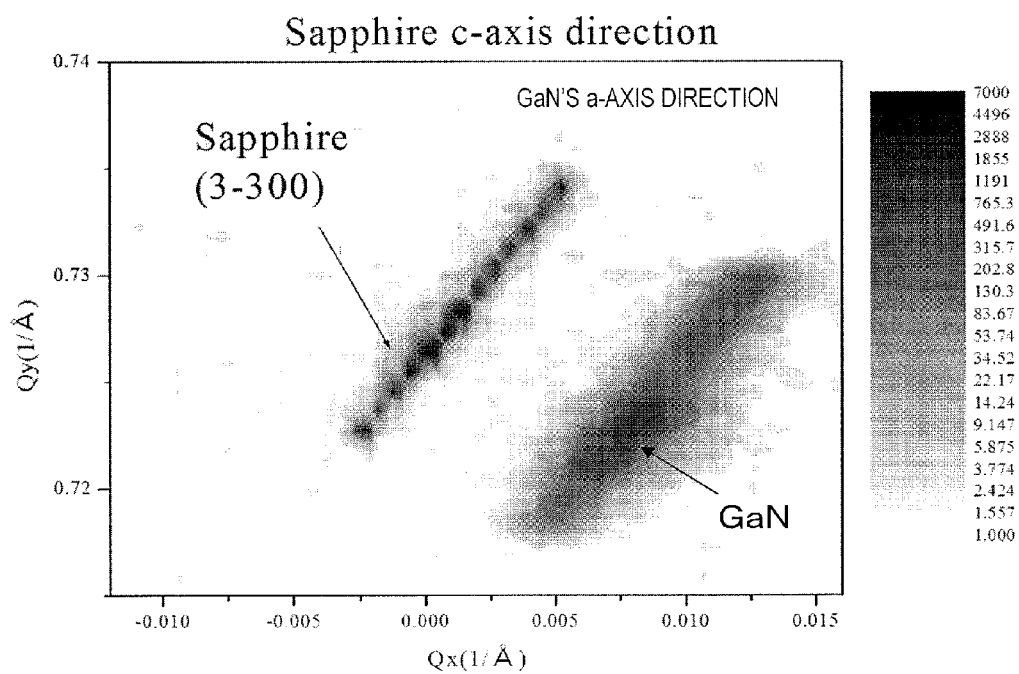

FIGS. 10A to 10C show the results of a reciprocal lattice mapping measurement that was carried out on a hetero-nitride semiconductor substrate 600 according to Example 1, wherein FIG. 10A shows a relation between the direction in which an X-ray was incident on a striped patterned substrate structure 510 during the reciprocal lattice mapping measurement and the crystal axis of GaN, FIG. 10B shows the results obtained when an X-ray was incident in the c-axis direction of GaN, and FIG. 10C shows the results obtained when an X-ray was incident in the a-axis direction of GaN.

FIGS. 11A and 11B are schematic representations showing how the results obtained by the reciprocal lattice mapping measurement should be interpreted when the crystal lattice was not tilted and when the crystal lattice was tilted, respectively.

FIG. 12 shows the results of the reciprocal lattice mapping measurement that were obtained in Comparative Example 1 when an X-ray was incident in the a-axis direction of GaN.

Portions (a) to (d) of FIG. 13 show the results of the reciprocal lattice mapping measurements that were obtained from hetero-nitride semiconductor substrates 600 including crystal growth seed regions and having mutually different S widths of 0, 10, 50 and 100 μm in Comparative Example 1, Comparative Example 2, Example 1 and Example 2, respectively.

Figure 14:
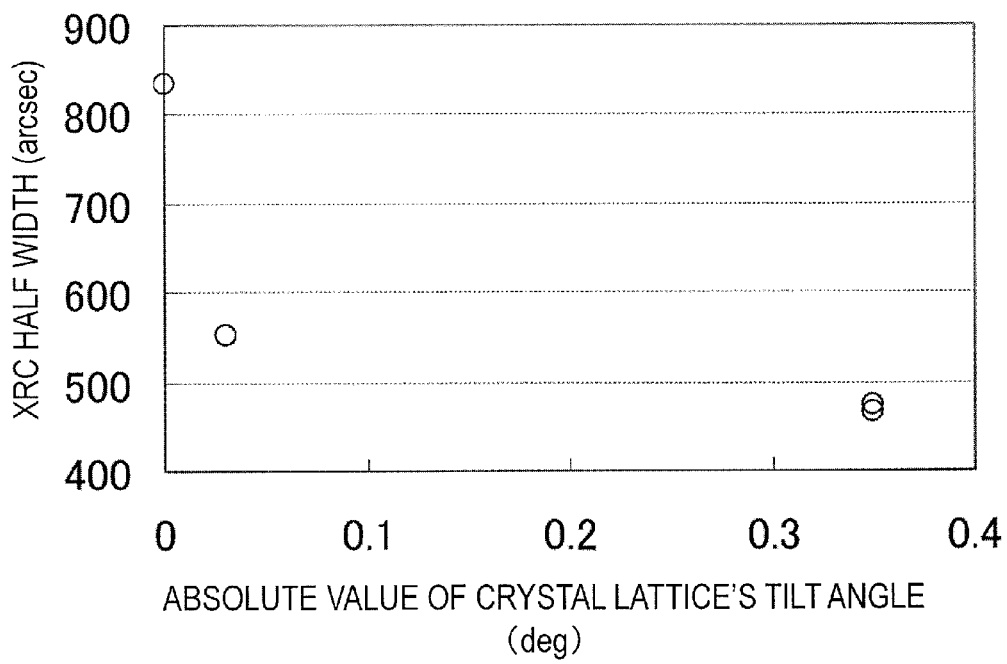

FIG. 14 shows how the XRC full width at half maximum changes with the tilt angle α of a crystal lattice.

Figure 15:
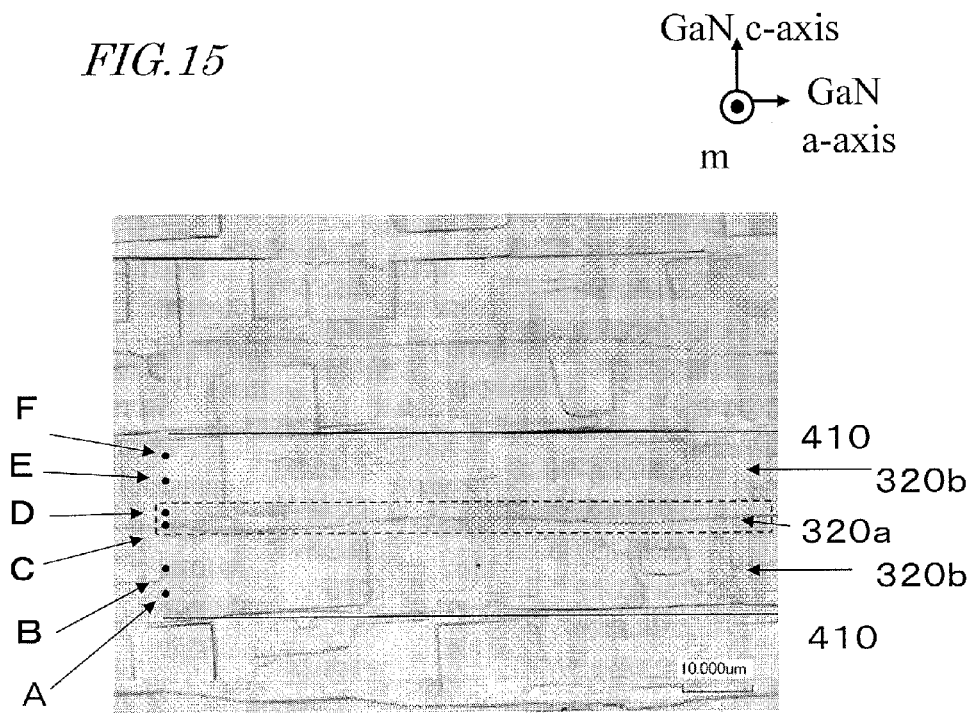

FIG. 15 illustrates the surface morphology of a nitride semiconductor substrate 600 according to Example 3.

Figure 16:
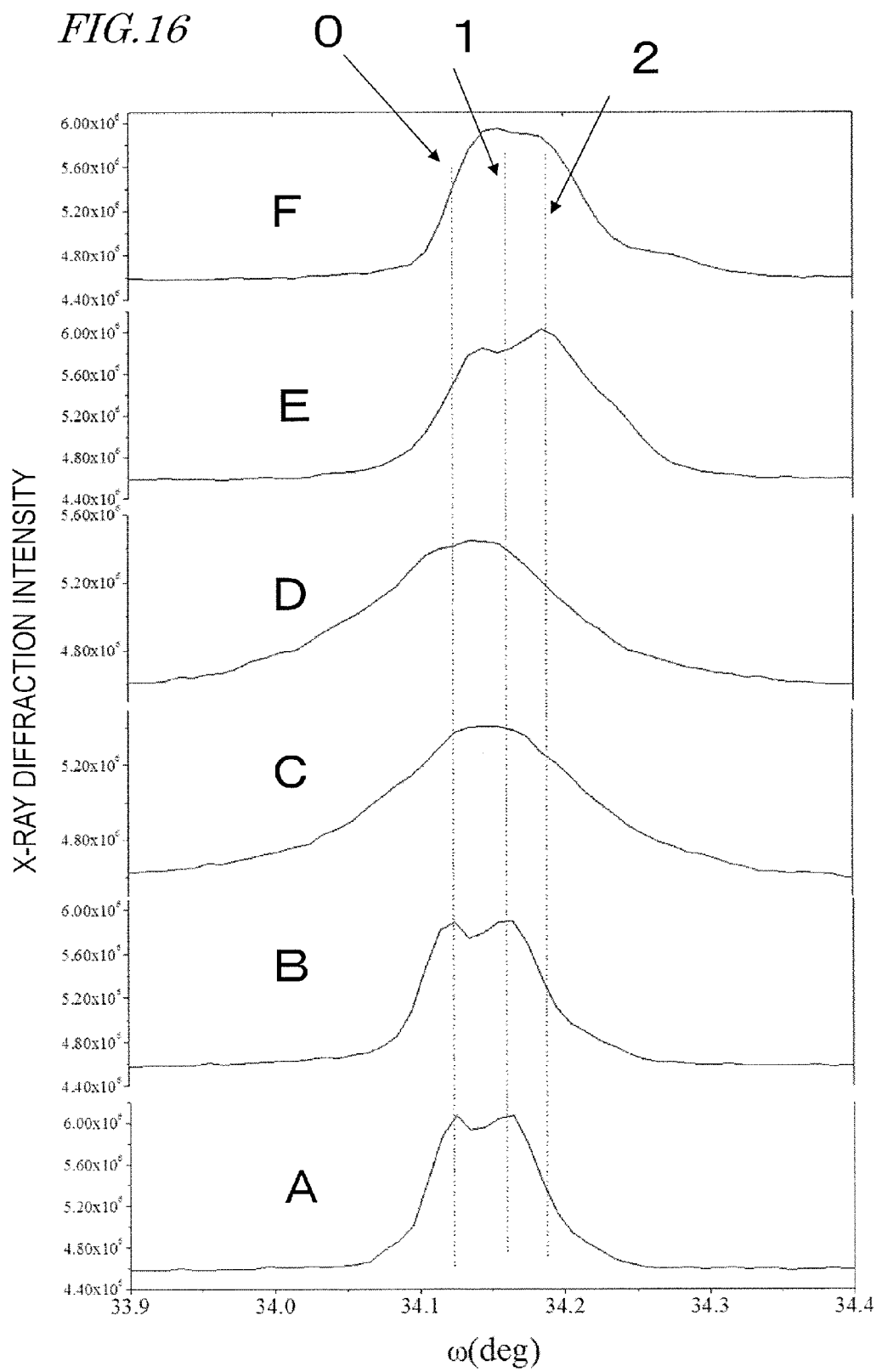

FIG. 16 is a graph showing the results of a micro-region X-ray rocking curve measurement which was carried out on a GaN (2-200) plane of a hetero-nitride semiconductor substrate 600 according to Example 3.

Figure 17:
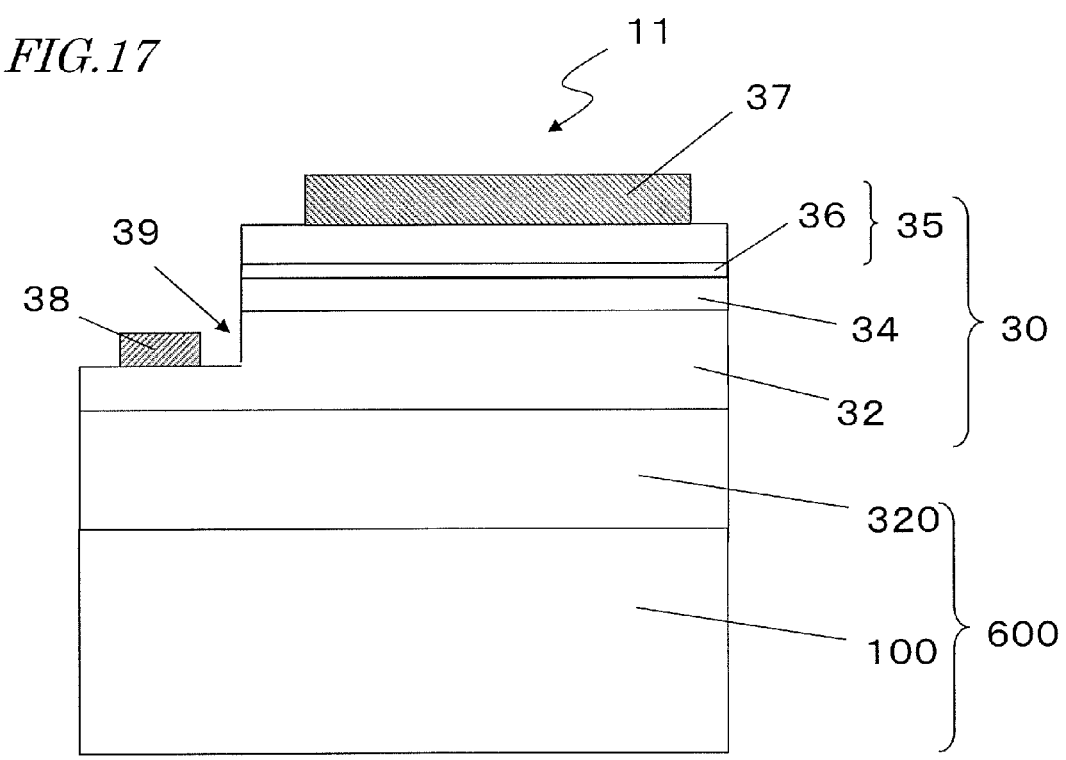

FIG. 17 is a schematic cross-sectional view illustrating a nitride-based semiconductor light-emitting element according to the second embodiment.

Figure 18:
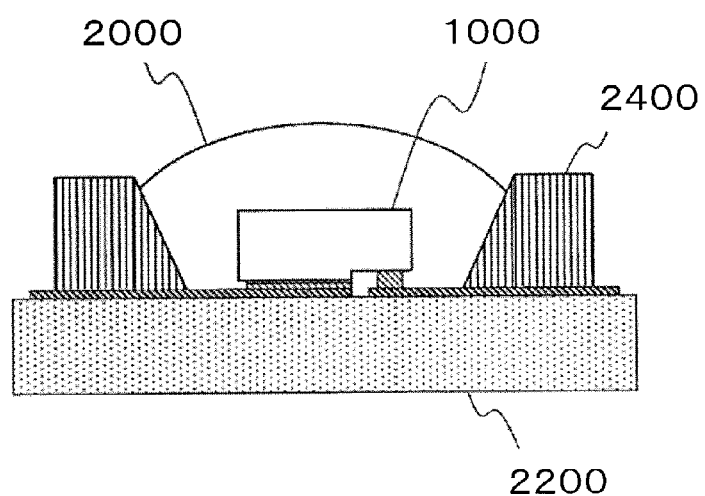

FIG. 18 is a cross-sectional view illustrating a white light source according to the third embodiment.

DETAILED DESCRIPTION

Figure 3:
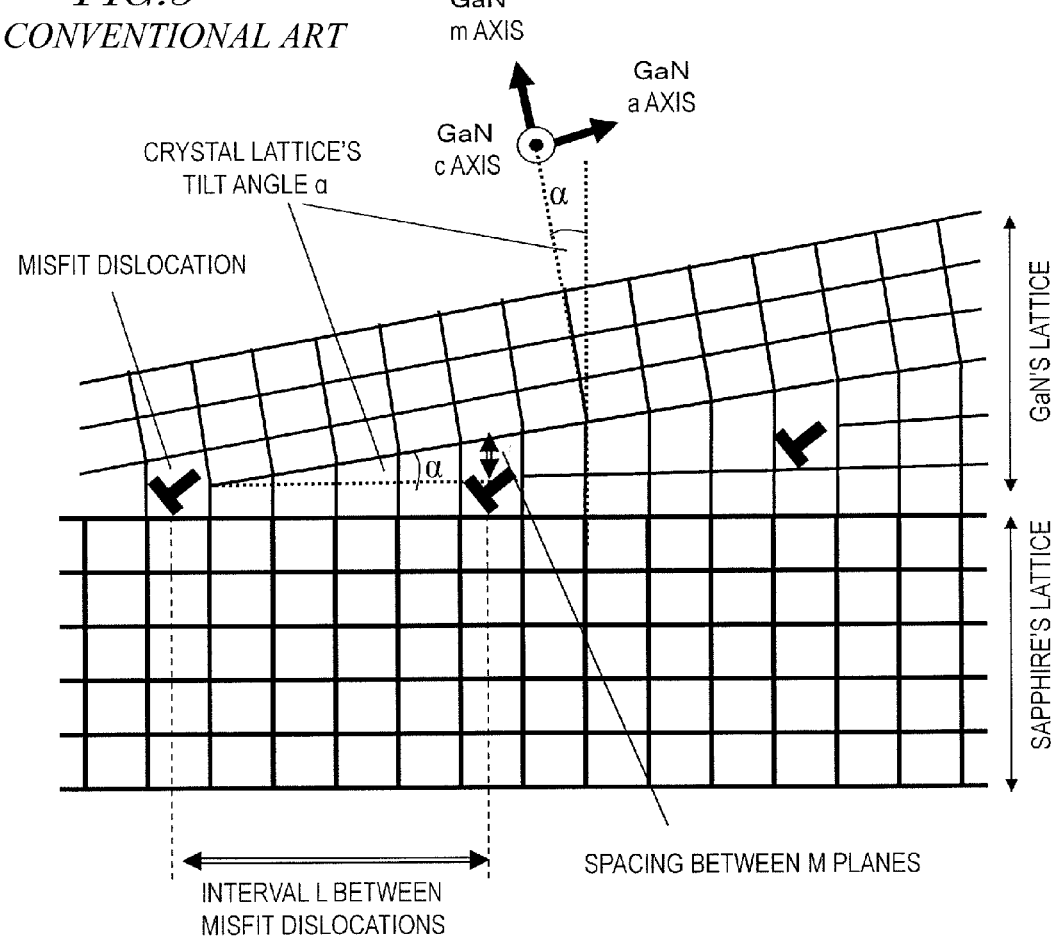
FIG. 3 illustrates how a crystal plane gets tilted due to a misfit dislocation at a hetero-interface of a nitride semiconductor, of which the principal surface is an m-plane.

Before embodiments of the present disclosure are described, it will be described with reference to FIG. 3 how much the crystal lattice would tilt due to misfit dislocations if crystals of m-plane GaN are grown on an m-plane sapphire substrate. FIG. 3 shows the tilt of the crystal lattice as observed in the c-axis direction of GaN during the growth of m-plane GaN crystals on an m-plane sapphire substrate. If there is a significant degree of lattice mismatch in the in-plane direction between a nitride semiconductor layer which has grown epitaxially and a growing substrate, misfit dislocations with dislocation lines that run in one direction arise to resolve the mismatch. If the growing principal surface is an m-plane, the dislocation lines of the misfit dislocation are formed mostly parallel to the c-axis but are hardly formed in the a-axis direction that intersects with the c-axis at right angles. Such a phenomenon rarely happens when crystals grow from the principal surface that is a highly symmetric polar plane (i.e., a c-plane) as in a conventional crystal-growing process, and is peculiar to crystals which grow from a principal surface that is a non-polar plane or a semi-polar plane. When such misfit dislocations with dislocation lines that run in one direction arise, a normal to the crystal lattice of a nitride semiconductor layer that has grown epitaxially will tilt with respect to a normal to the growing substrate (see Applied Physics Letters 99, 131909 (2011)). Such tilt of the crystal lattice is caused by the addition of one layer of the crystal plane involved with the occurrence of the misfit dislocations. As shown in FIG. 3, while crystals of m-plane GaN grow on an m-plane sapphire substrate, the m-axis of GaN will rotate on the c-axis of GaN in the a-axis direction with respect to the m-axis of sapphire.

According to Applied Physics Letters 99, 131909 (2011), supposing the lattice strain to be caused to m-plane GaN crystals growing on an m-plane sapphire substrate has been relaxed completely, the interval L between adjacent misfit dislocations at their interface depends on the degree of lattice mismatch $\in$ [%] between the a-axis of GaN and the c-axis of the sapphire substrate and the a-axis lattice constant GaN_$a_o$ of GaN and is given by the following Equation (1):

$$L = \frac{\text{GaN\_a}_0}{\varepsilon} \times 100 \quad (1)$$

In this Equation (1), the lattice relaxation at the interface is supposed to have been caused via Burgers vector.

The tilt angle α of the crystal lattice is determined by the interval L between adjacent misfit dislocations and the m-axis lattice constant GaN_$m_o$ of GaN and is given by the following Equation (2):

$$\alpha = \tan^{-1}\left(\frac{\text{GaN\_m}_0}{L}\right) \quad (2)$$

That is to say, the following Equation (3)

$$\alpha = \tan^{-1}\left(\frac{\text{GaN\_m}_0}{\text{GaN\_a}_0} \cdot \frac{\varepsilon}{100}\right) \quad (3)$$

is satisfied.

Since there is a significant degree of lattice mismatch between the sapphire substrate and GaN, the crystals will grow in the domain matching epitaxy (DME) mode (see Journal of Applied Physics 93, 278, (2003)). If m-plane GaN crystals are grown on an m-plane sapphire substrate, lattice match will be found between the a-axis direction spacing (1.5925 Å) of GaN multiplied by four and the c-axis direction spacing (2.165 Å) of sapphire multiplied by three. In this case, the a-axis direction spacing (1.5925 Å) of GaN is a half as large as the a-axis lattice constant (3.185 Å) of GaN. On the other hand, the c-axis direction spacing (2.165 Å) of sapphire is one sixth as large as the c-axis lattice constant (12.99 Å) of sapphire. As can be seen, in the case of the DME mode, the degree of lattice mismatch s between the c-axis of sapphire and the a-axis of GaN is approximately 1.8%. That is to say, care should be taken when calculating the degree of lattice mismatch $\in$.

Supposing lattice relaxation has been achieved completely for m-plane GaN crystals growing on an m-plane sapphire substrate, the misfit dislocation interval L is estimated to be approximately 177 Å according to Equation (1). That is to say, on such supposition, if lattice relaxation has been achieved completely for the GaN crystal lattice in the DME mode, the tilt angle α of the crystal lattice is estimated to be 0.89 degrees.

For example, in the case of m-plane GaN crystals growing on an m-plane SiC substrate, the degree of lattice mismatch between the a-axis of SiC and the a-axis of GaN is approximately 3%. If lattice relaxation has been achieved completely for the GaN crystal lattice, the tilt angle α of the crystal lattice is estimated to be 1.5 degrees.

As can be seen, when m-plane GaN crystals are grown on an m-plane sapphire substrate, misfit dislocations arise to reduce (and relax) the strain in the strained crystals. In an actual hetero-epitaxial growth process, however, lattice relaxation is rarely achieved completely in a nitride semiconductor layer. That is to say, in most cases, there should be some residual strain in the nitride semiconductor layer and the tilt angle α of the crystal lattice should be smaller than what is calculated by Equation (3). The percentage of the residual strain $\in_{eff}$ [%] remaining in the nitride semiconductor layer is calculated by the following Equation (4):

$$\varepsilon_{eff} = \varepsilon - \frac{\text{GaN\_a}_0}{\text{GaN\_m}_0}\tan\alpha \times 100[\%] \quad (4)$$

As can be seen from this Equation (4), if m-plane GaN crystals are grown on an m-plane sapphire substrate, the percentage of the residual strain remaining in the m-plane GaN layer can be estimated by measuring the tilt angle α of the crystal lattice. In this case, the tilt angle α of the crystal lattice can be evaluated with an X-ray diffraction analyzer. Specifically, in measuring the tilt angle α of the crystal lattice of m-plane GaN in the a-axis direction, the tilt angle α can be evaluated by reciprocal lattice mapping with an X ray made to be incident parallel to the a-axis direction.

Applied Physics Express 3, 011004 (2010) and Applied Physics Letters 99, 131909 (2011) report that such a tilted crystal lattice is observed in a nitride semiconductor hetero-structure in which nitride semiconductors growing on either a semi-polar plane or an m-plane that is a non-polar plane have different In or Al mole fractions.

The structure described above uses a sapphire substrate unlike the hetero-structure consisting of only nitride semiconductors as disclosed in Applied Physics Express 3, 011004 (2010) and Applied Physics Letters 99, 131909 (2011). However, since lattice mismatch naturally arises at the interface, some tilt of the crystal lattice should be observed there.

That is why the tilt of this crystal lattice should ordinarily depend on the degree of lattice mismatch between the substrate and a nitride semiconductor film to grow on the substrate and on the thickness of the nitride semiconductor film.

The present inventors discovered that by applying a lateral selective growing technique to the hetero-epitaxial growth of a nitride semiconductor on an m-plane that is a non-polar plane, the tilt angle of the crystal lattice can be controlled.

The lateral selective growing technique is a technique for obtaining a quality nitride semiconductor film by reducing the density of dislocations with a plurality of crystal growth seed regions provided and with crystals allowed to regrow selectively only from those crystal growth seed regions.

The present inventors discovered that in the lateral selective growth of an m-plane nitride semiconductor according to the present disclosure, by setting the spacing (which will be referred to herein as an "S width") between adjacent ones of those crystal growth seed regions to be equal to or greater than 20 μm, the tilt angle of the crystal lattice could be increased so significantly that the lattice relaxation could be promoted and the strain applied to the nitride semiconductor could be reduced drastically enough to realize a hetero nitride semiconductor multilayer structure of quality.

The crystal lattice tilt model described above is supposed to be observed in an m-plane nitride semiconductor film to grow on a sapphire substrate that is a hetero substrate (i.e., a single film is supposed to grow on that substrate). In that case, the magnitude of tilt of the crystal lattice changes according to the degree of lattice mismatch, the percentage of the strain, and the thickness of the film. That is to say, the m-plane nitride semiconductor film is subjected to the strain mainly at the interface with the sapphire substrate and the strain is caused in the m-axis direction that is the growing direction.

On the other hand, in the lateral selective growing technique of the present disclosure, the nitride semiconductor film is supposed to regrow laterally from the c-plane of those crystal growth seed regions in the c-axis direction.

That is to say, the strain that has been caused at the interface between m-planes in the case of the single film growth could be reduced more significantly by adopting the selective growing technique to change the crystal growing direction from the m-axis direction into the c-axis direction.

The present inventors also discovered that such an effect of reducing the strain by adopting the lateral selective growing technique could not be achieved at an S width of 5 to 10 μm, which is used in a conventional lateral selective growing technique, but could be achieved significantly at a greater S width of 20 μm or more.

The present inventors further discovered that in such a lateral selective growing sample in which the lattice relaxation could be promoted (i.e., of which the strain could be relaxed), the degree of crystallinity could be improved significantly as well.

An embodiment of the present disclosure is as described below.

A nitride semiconductor structure according to one embodiment of the present disclosure includes: a plurality of crystal growth seed regions formed of a nitride semiconductor, of which the principal surface is an m-plane and which extends to a range that defines an angle of not less than 0 degrees and not more than 10 degrees with respect to an a-axis; and a laterally grown region formed of a nitride semiconductor which has extended in a c-axis direction from each of the plurality of crystal growth seed regions. An S width that is the spacing between adjacent ones of the plurality of crystal growth seed regions is at least 20 μm. By adopting this configuration, the lattice strain in the laterally grown region can be relaxed and a nitride semiconductor with reduced strain can be obtained.

In one embodiment, the S width that is the spacing between adjacent ones of the plurality of crystal growth seed regions is 50 μm or more. In such an embodiment, the lattice strain in the laterally grown region can be relaxed so much that a nitride semiconductor with good crystallinity, of which the strain has been reduced to approximately one third, can be obtained.

In one embodiment, the S width that is the spacing between adjacent ones of the plurality of crystal growth seed regions is 100 μm or less. By setting the S width to be 100 μm or less, the laterally grown regions can be combined together more easily and a nitride semiconductor structure with good planarity can be obtained in a short crystal growth time.

In one embodiment, the m-axis of the laterally grown region defines a tilt angle of α degrees in the a-axis direction of the nitride semiconductor with respect to the m-axis of the crystal growth seed regions. The angle of α degrees is greater than zero degrees, and has been calculated by evaluating the crystal growth seed regions and the laterally grown region separately from each other using a microarea X-ray diffractometer with a small spot size.

In one embodiment, the m-axis of the laterally grown region defines a tilt angle of α degrees in the a-axis direction of the nitride semiconductor with respect to the m-axis of the crystal growth seed regions. The angle of α degrees is greater than zero degrees and equal to or smaller than 0.35 degrees, and has been calculated by making an X-ray incident parallel to the a-axis direction of a nitride semiconductor layer and by detecting a difference in diffraction peak position in the nitride semiconductor layer between the laterally grown region and the crystal growth seed regions by X-ray reciprocal lattice mapping with respect to the diffraction peak position in a growing substrate.

Another nitride semiconductor structure according to the present disclosure includes: a sapphire substrate, of which the principal surface is an m-plane; a plurality of crystal growth seed regions formed of a nitride semiconductor which has been formed on the sapphire substrate, of which the principal surface is an m-plane, and which extends to a range that defines an angle of not less than 0 degrees and not more than 10 degrees with respect to an a-axis; and a laterally grown region formed of a nitride semiconductor which has extended in a c-axis direction from each of the plurality of crystal growth seed regions. An S width that is the spacing between adjacent ones of the plurality of crystal growth seed regions is at least 20 μm. By adopting this configuration, the lattice strain in the laterally grown region can be relaxed and a nitride semiconductor with reduced strain can be obtained. In addition, by using a sapphire substrate, the structure can have increased mechanical strength and can be handled more easily as well.

In one another embodiment, the S width that is the spacing between adjacent ones of the plurality of crystal growth seed regions is 50 μm or more. In such an embodiment, the lattice strain in the laterally grown region can be relaxed so much that a nitride semiconductor with good crystallinity, of which the strain has been reduced to approximately one third, can be obtained.

In one another embodiment, the S width that is the spacing between adjacent ones of the plurality of crystal growth seed regions is 100 μm or less. By setting the S width to be 100 μm or less, the laterally grown regions can be combined together more easily and a nitride semiconductor structure with good planarity can be obtained in a short crystal growth time.

In one another embodiment, the m-axis of the crystal growth seed regions defines a tilt angle of β1 degrees in the a-axis direction of the nitride semiconductor with respect to the m-axis of the sapphire substrate. The m-axis of the laterally grown region defines a tilt angle of β2 degrees in the a-axis direction of the nitride semiconductor with respect to the m-axis of the sapphire substrate. The angle β2 is larger than the angle β1. The angles β1 and β2 have been calculated by evaluating the crystal growth seed regions and the laterally grown region separately from each other using a microarea X-ray diffractometer with a small spot size.

In one another embodiment, if an angle α is calculated to be (the angle β2–the angle β1), the angle α is larger than zero degrees and equal to or smaller than 0.35 degrees. The angles β1 and β2 have been calculated by making an X-ray incident parallel to the a-axis direction of a nitride semiconductor layer and by detecting a diffraction peak position in the nitride semiconductor layer in the laterally grown region by X-ray reciprocal lattice mapping with respect to the diffraction peak position in the sapphire substrate.

By adopting this configuration, the lattice relaxation can be promoted in the laterally grown region. As a result, a nitride semiconductor with reduced strain and good crystallinity can be obtained.

Hereinafter, embodiments of the present disclosure will be described in detail with reference to the accompanying drawings. In the accompanying drawings, any pair of components shown in multiple drawings and having substantially the same function will be identified by the same reference numeral for the sake of simplicity of description. It should be noted that the present disclosure is in no way limited to the illustrative embodiments to be described below.

In the embodiments to be described below, gallium nitride (GaN) layers are used mostly as the nitride semiconductor layer, crystal growth seed regions and laterally grown region. However, those layers may include Al, In and B. For example, those layers may be AlN layers. Also, the nitride semiconductor layer, crystal growth seed regions and laterally grown region do not have to be formed of only GaN layers but may include a single $Al_xGa_yIn_zN$ (where $0 \leq x \leq 1$, $0 < y \leq 1$, $0 \leq z \leq 1$ and $x+y+z=1$) layer, an alternate stack of $Al_xGa_yIn_zN$ (where $0 \leq x \leq 1$, $0 < y \leq 1$, $0 \leq z \leq 1$ and $x+y+z=1$) layers with mutually different compositions, or those layers to which element B has been further added.

In each of the embodiments to be described below, a nitride semiconductor, of which the principal surface is an m-plane, is supposed to grow hetero-epitaxially on an m-plane sapphire substrate. However, this is just an example of the present disclosure. Rather, any substrate may be used as a hetero-epitaxially growing substrate as long as a nitride semiconductor layer, of which the principal surface is an m-plane that is a non-polar plane, can grow on the substrate. Examples of such nitride semiconductor growing substrates, of which the principal surface is an m-plane, include an a-plane sapphire substrate, an m-plane SiC substrate, an m-plane ZnO substrate, an $LiAlO_2$ substrate, and a $Ga_2O_3$ substrate. Optionally, the surface of these growing substrates may be subjected to a patterning process. Or the growing substrate may also be an Si substrate.

(Embodiment 1)

Figure 4A:
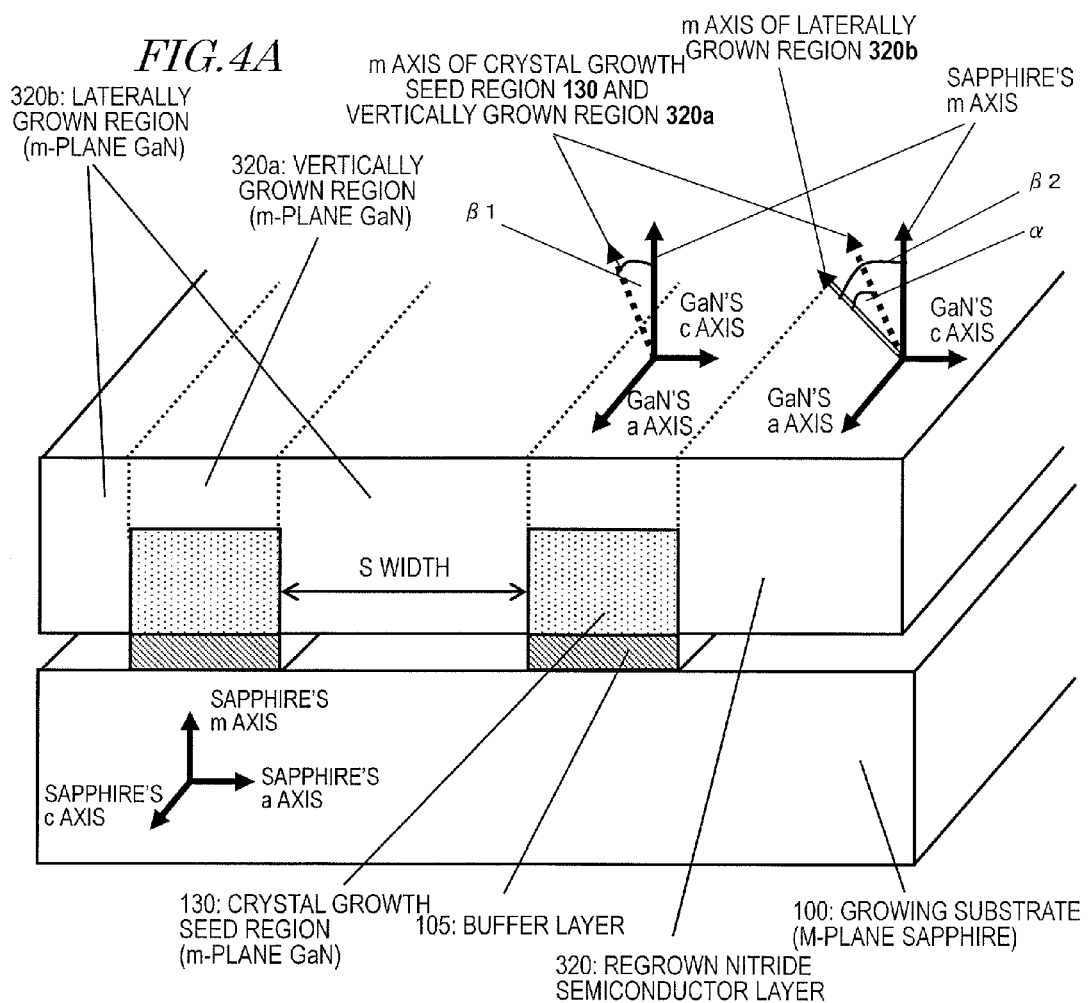
FIGS. 4A and 4B illustrate a hetero-nitride semiconductor substrate according to the first embodiment.

Hereinafter, a hetero nitride semiconductor substrate as a first embodiment will be described with reference to FIG. 4A.

The hetero nitride semiconductor substrate of this embodiment includes a growing substrate 100 of m-plane sapphire, crystal growth seed regions 130 of a nitride semiconductor which have been formed on the growing substrate 100 with a buffer layer 105 interposed between them, and a regrown nitride semiconductor layer 320 which has been formed to cover the crystal growth seed regions 130. The crystal growth seed regions 130 run in the a-axis direction of the nitride semiconductor layer. However, the direction in which the crystal growth seed regions 130 run does not have to exactly agree with the a-axis direction of the nitride semiconductor layer, but may define a tilt angle of not less than 0 degrees and not more than ±10 degrees with respect to the a-axis direction in a plane that intersects with the m-axis direction at right angles. A plurality of crystal growth seed regions 130 have been formed, and the spacing between adjacent ones of the crystal growth seed regions 130 will be referred to herein as a "space width (S width)".

The regrown nitride semiconductor layer 320 includes vertically grown regions 320a in which crystals have grown upward from the crystal growth seed regions 130 and laterally grown regions 320b in which crystals have grown laterally from the crystal growth seed regions 130.

If the S width is set to be equal to or greater than 20 μm, lattice relaxation can be further promoted in the regrown nitride semiconductor layer 310. If the S width is set to be equal to or greater than 50 μm, the lattice strain can be relaxed sufficiently in the laterally grown regions to approximately one third compared to a single nitride semiconductor film with no laterally grown regions 320b. In addition, the half width of an XRC measurement indicating the degree of crystallinity decreases. In this manner, a nitride semiconductor with a decreased residual strain and with an increased degree of crystallinity can be obtained.

And if the S width is set to be equal to or smaller than 100 μm, the laterally grown regions 320b can be combined together more easily and a regrown nitride semiconductor layer 320 with a high degree of planarity can be obtained by performing the crystal-growing process for just a short time.

The m-axis of the crystal growth seed regions 130 and vertically grown regions 320a defines a tilt angle β1 in the a-axis direction of the nitride semiconductor with respect to the m-axis of the growing substrate 100 of m-plane sapphire. On the other hand, the m-axis of the laterally grown regions 320b defines a tilt angle β2 in the a-axis direction of the nitride semiconductor with respect to the m-axis of the growing substrate 100 of m-plane sapphire. Since the crystal lattice is further relaxed in the laterally grown regions 320b, the m-axis of the laterally grown regions 320b defines a greater tilt angle with respect to the m-axis of the growing substrate 100 of m-plane sapphire. That is to say, the angle β2 becomes larger than the angle β1. Supposing the angle α is calculated by β2-β1, the m-axis of the crystal growth seed regions 130 and vertically grown regions 320a and the m-axis of the laterally grown regions 320b define the tilt angle α in the a-axis direction of the nitride semiconductor, where the angle α is a value which is larger than 0 degrees and equal to or smaller than 0.35 degrees. In the laterally grown regions 320b, the more significantly the crystal lattice is relaxed, the closer to 0.35 degrees the angle α becomes.

Figure 4B:
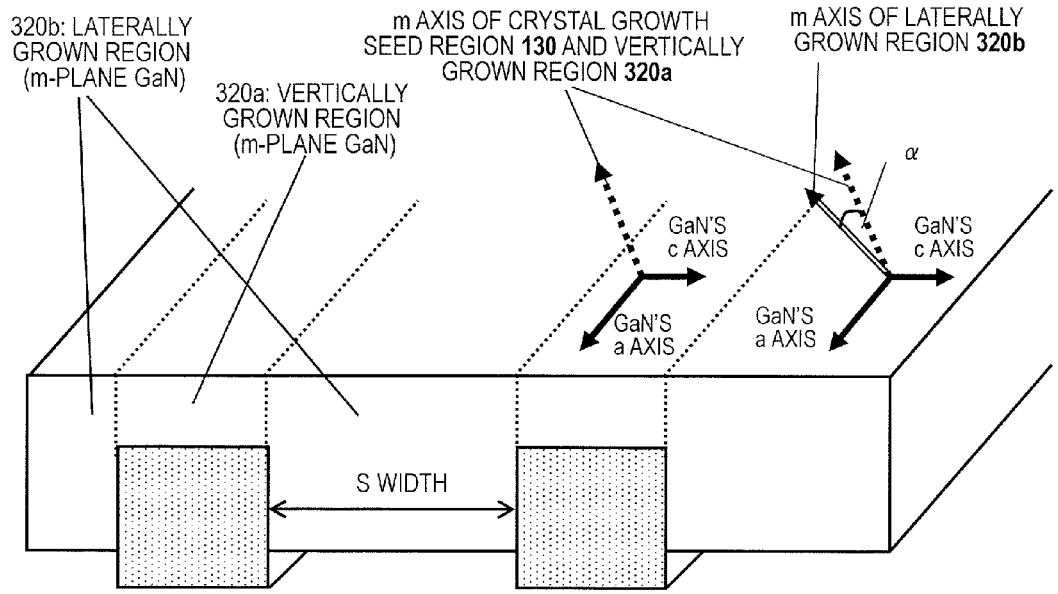

Optionally, the growing substrate 100 may be removed as shown in FIG. 4B. In that case, the angles β1 and β2 cannot be defined but the angle α can be defined. That is to say, the m-axis of the crystal growth seed regions 130 and vertically grown regions 320a and the m-axis of the laterally grown regions 320b define a tilt angle α in the a-axis direction of the nitride semiconductor, where the angle α is a value which is larger than 0 degrees and equal to or smaller than 0.35 degrees. In the laterally grown regions 320b, the more significantly the crystal lattice is relaxed, the closer to 0.35 degrees the angle α becomes.

Alternatively, each of those crystal growth seed regions 130 may be capped with a mask 120 as shown in portion (d) of FIG. 5. In this embodiment, a junction 400 is located over the mask 120.

Still alternatively, the crystal growth seed region 130 may have a patterned structure 131, of which the recesses are covered with a mask 121, as shown in portion (e) of FIG. 7.

Hereinafter, it will be described with reference to FIGS. 4A and 4B how the tilt of the crystal lattice affects the lattice relaxation.

As described above, in the hetero-epitaxial growth of m-plane GaN, the dislocation lines of the misfit dislocations run in the c-axis direction. That is why according to this embodiment, the crystal growth seed regions 130 are extended to a range which defines an angle of not less than 0 degrees and not more than 10 degrees with respect to the a-axis substantially perpendicularly to the c-axis. As a result, a plurality of misfit dislocations can be caused in the crystal growth seed regions 130 across the direction in which the crystal growth seed regions 130 run. Consequently, due to these misfit dislocations, the crystal lattice gets tilted, and the m-axis of the crystal growth seed regions 130 tilts in the a-axis direction of the nitride semiconductor with respect to the m-axis of sapphire. If the vertically grown regions 320a have been formed over the crystal growth seed regions 130, then the m-axis of the vertically grown regions 320a also tilts in the a-axis direction of the nitride semiconductor with respect to the m-axis of sapphire. In this case, the angle defined by the respective m axes of the crystal growth seed regions 130 and growing substrate 100 of m-plane sapphire with respect to the a-axis direction of the nitride semiconductor is supposed to be β1. Furthermore, according to this embodiment, by setting the spacing (i.e., S width) between adjacent ones of the crystal growth seed regions 130 to be sufficiently large, the lattice relaxation can be promoted in the laterally grown regions 320a. As shown in FIGS. 4A and 4B, the laterally grown regions 320b are affected by the strain only where the laterally grown regions 320b contact with the crystal growth seed regions 130. That is why if the nitride semiconductor grows laterally in the ±c-axis directions of GaN from the crystal growth seed regions 130, the laterally grown regions 320b are not easily affected by the growing substrate 100 of m-plane sapphire. That is to say, the growing planes of the laterally grown regions 320b except for the upper and lower m- and c-axis directions are free spaces, and therefore, are not affected by the strain easily. That is to say, in these laterally grown regions 320b, misfit dislocations are easily caused, lattice relaxation arises often and the tilt of the crystal lattice increases during an early stage of the regrowth. As a result, the strain in the crystals would be reduced and the crystallinity would be improved. On the other hand, the crystal growth seed regions 130 which are growing directly on the growing substrate 100 of m-plane sapphire and the vertically grown regions 320a provided over the crystal growth seed regions 130 are easily affected by the strain at the interface. The strain is likely to remain in these regions and the lattice relaxation is caused less easily than in the laterally grown regions 320b described above.

That is to say, according to this embodiment, by using crystal growth seed regions 130 that run in a predetermined direction and by setting the S width to be a sufficiently large value, the lattice relaxation is caused purposely in the laterally grown regions 320b. As a result, the strain of the crystals can be reduced and the crystallinity of the regrown nitride semiconductor can be improved.

The present inventors discovered and confirmed via experiments that such an effect of promoting the lattice relaxation (i.e., relaxing the strain) by such lateral growth can not be achieved at an S width of around 10 µm, which is generally adopted in a lateral growth process (see the results obtained in Comparative Example 2). That is to say, to promote the lattice relaxation (i.e., to relax the strain) in the laterally grown regions 320b, the S width is suitably not less than 20 µm (see the results obtained in Example 3) and more suitably set to be equal to or greater than 50 µm (see the results obtained in Examples 1 and 2).

The lateral selective growing technique to be used in the present disclosure does not have to be any particular method. Examples of the lateral selective growing techniques that can be used include the (masked or maskless) Pendeo growing method, the ABLEG method and the FLOG method. Hereinafter, it will be described in detail how to fabricate a nitride semiconductor structure according to this embodiment by carrying out the lateral selective growth process by any of these techniques.

Portions (a) to (d) of FIG. 5 are cross-sectional views illustrating respective process steps of a lateral selective growth process by the masked Pendeo method. As shown in portion (a) of FIG. 5, after a buffer layer 105 of a nitride semiconductor and a nitride semiconductor layer 110 have been grown on a growing substrate 100 of m-plane sapphire, a mask 120 of a dielectric material, for example, is formed on the upper surface of the nitride semiconductor layer 110. The mask 120 may be either a dielectric film including oxygen, nitrogen and carbon or a metal film including some of these elements. For example, if the mask 120 is formed of a film including oxygen, a film of $SiO_2$, $TiO_2$, $Ga_2O_3$, $HfO_2$, $Al_2O_3$, $TaO_x$ or ZrO may be used. On the other hand, if the mask 120 is formed of a film including nitrogen, a film of SiN, $SiN_x$, $Si_3N_4$, SiON, TiN or CrN may be used. If the mask 120 is formed of a film including carbon, a diamond film or a diamond-like carbon film may be used. And if the mask 120 is formed of a metal film, a film of B, Al, Ni, W, Ti, Ag, Cu or Rh may be used. Or the mask 120 may also be formed by patterning a film including any of these materials in some portion. A part of the nitride semiconductor layer 110 functions as a crystal growth seed region 130 to be a seed crystal during the regrowth.

The mask 120 of this embodiment has openings which run in stripes in the direction coming out of the paper on which FIG. 5 is drawn. The planar layout of the mask 120 is designed so as to define the shape and location of the crystal growth seed region 130.

In this embodiment, the crystal growth seed regions 130 are formed so as to run in a predetermined direction within the principal surface. In this embodiment, the predetermined direction is supposed to be the a-axis direction of the nitride semiconductor. However, this "predetermined direction" does not have to be perfectly parallel to the a-axis of the nitride semiconductor but may also be set so as to define an angle falling within a particular narrow range. More specifically, the predetermined direction is set so as to define an angle of not less than 0 degrees and not more than 10 degrees with respect to the a-axis.

Next, as shown in portion (b) of FIG. 5, exposed portions 200 of the nitride semiconductor layer 110 which have not been covered with the mask 120 are etched away to pattern the nitride semiconductor layer 110 into stripes. Those exposed portions 200 are etched to the point that the surface of the growing substrate 100 of m-plane sapphire is partially exposed. In this manner, a plurality of crystal growth seed regions 130 of ridged nitride semiconductor are formed so as to run in the direction coming out of the paper. A recess 210 is left between adjacent ones of the crystal growth seed regions 130. The width of each recess 210 substantially agrees with the spacing (i.e., the S width) between the adjacent crystal growth seed regions. In this manner, a patterned substrate 500, of which the surface has been patterned into a striped unevenness, is provided. In the example illustrated in FIG. 4B, recesses are also cut on the growing substrate 100 of m-plane sapphire as a result of this etching process, and the side surfaces 220 of the recesses are exposed.

Next, as shown in portion (c) of FIG. 5, a regrown nitride semiconductor 310 is formed on the patterned substrate 500. In this description, to "regrow" means growing the nitride semiconductor 310 from the crystal growth seed regions 130 that have been patterned.

During this regrowth, no nitride semiconductor grows on the mask 120 and the mask 120 serves as a regrowth checking layer.

No nitride semiconductor grows, either, in the recesses 210 where the surface of the sapphire substrate has been exposed as a result of the etching process.

Thus, in this patterned substrate 500, the nitride semiconductor can be grown laterally from the respective side surfaces of the crystal growth seed regions 130. This laterally grown nitride semiconductor will be referred to herein as a "laterally grown region 310b". In portion (c) of FIG. 5, illustrated are laterally grown regions 310b which are still growing.

In one embodiment, the recesses 210 are arranged at regular intervals. However, neither the width nor the interval (pitch) of the recesses 210 has to be constant over the entire principal surface of the growing substrate 100 of m-plane sapphire. Furthermore, the unevenness formed by the recesses 210 and the crystal growth seed regions 130 does not have to run quite straight in a predetermined direction, either.

If the growth condition for forming the regrown nitride semiconductor 310 on the patterned substrate 500 shown in portion (b) of FIG. 5 is appropriately selected, crystals will regrow preferentially from the side surfaces of the crystal growth seed regions 130 so as to cover the exposed recesses 210 of the growing substrate 100 of m-plane sapphire. And if the crystals are allowed to grow continuously, adjacent laterally grown regions 310b will soon combine together to form junctions 410. As a result, the partially exposed surface of the growing substrate 100 of m-plane sapphire gets covered with the regrown nitride semiconductor 310. And if the crystals are allowed to further grow, then the regrown nitride semiconductor 310 will start to grow perpendicularly to the substrate (i.e., in the m-axis direction) in turn to cover the mask 120 entirely. As a result, the regrown nitride semiconductor 310 forms the junctions 400 over the mask 120, too, and eventually a flat regrown nitride semiconductor 310 is formed as shown in portion (d) of FIG. 5. Such a structure in which a nitride semiconductor has grown in this manner on a growing substrate which is not made of a nitride semiconductor material will be sometimes referred to herein as a "hetero-nitride semiconductor substrate". In portion (d) of FIG. 5, illustrated is such a hetero-nitride semiconductor substrate 610.

It should be noted that the regrown nitride semiconductor 310 does not have to be a single continuous film but there may be some gaps at the junctions 400 and 410.

As shown in portion (d) of FIG. 5, there may be gaps with no epitaxial layer between the bottom of the recesses 210 and the laterally grown regions 310b. These gaps are not necessarily required but may be almost eliminated from between the recesses 210 and the laterally grown regions, provided that plenty of crystal growth material is supplied. Nevertheless, since the tilt of the crystal lattice which contributes greatly to achieving a major effect of the present disclosure could be further promoted thanks to the presence of those gaps, the gaps are left intentionally in this embodiment.

If the Pendeo growth method is adopted, a configuration in which the junctions 400 over the mask 120 and the junctions 410 over the recesses 210 are arranged alternately is realized. In the Pendeo growth process, the depth of the recesses 210 cut by etching is suitably greater than the height of the crystal growth seed regions 130. The reason is that a polycrystalline nitride semiconductor of poor crystal quality could grow from the bottom of the recesses 210 of the substrate 100 during the regrowth process. In the Pendeo growth, the regrowth from the crystal growth seed regions 130 and the regrowth from the bottom of the recesses 210 have mutually different growth modes and the regrown nitride semiconductors 310 have different degrees of crystallinity, too.

It is important to totally check the regrowth from the bottom of the recesses 210 or to prevent the nitride semiconductor that has regrown, if ever, from the bottom of the recesses 210 from affecting the laterally regrown regions 310b. The deeper the recesses 210 and the greater the height of the side surfaces 220, the more difficult it is for the material to reach the bottom of the recesses 210 during the regrowth process. As a result, crystals grow preferentially from only the crystal growth seed regions 130 and the lateral selective growth is promoted. Even if the crystals regrow from the bottom of the recesses 210 but if the height of the side surfaces 220 is sufficient, the laterally grown regions 310b will be affected or interfered with only a little.

The Pendeo growth process can be carried out even without the mask 120 formed of a dielectric material as shown in portions (a) to (d) of FIG. 5. A Pendeo growth process that does not use any mask is called a "maskless Pendeo growth process". In that case, since no mask of a dielectric material is used, it is possible to prevent impurities from entering the growing nitride semiconductor from the masking material. As a result, no junctions 400 shown in portion (d) of FIG. 5 are formed over the mask 120. Hereinafter, it will be described with reference to portions (a) to (d) of FIG. 6 how to carry out the maskless Pendeo growth process.

Portions (a) to (d) of FIG. 6 are cross-sectional views illustrating respective process steps of a lateral selective growth process by the maskless Pendeo method. First of all, as shown in portion (a) of FIG. 6, a mask 120 is formed provisionally as in the masked Pendeo growth process. This mask 120 will be used as an etching mask to form the crystal growth seed regions 130. After the crystal growth seed regions 130 have been formed, the mask 120 is removed to obtain a patterned substrate 510 as shown in portion (b) of FIG. 6. Unlike the patterned substrate 500 shown in portion (b) of FIG. 5, the upper surface of the crystal growth seed regions 130 is not covered with the mask on the patterned substrate 510 as shown in portion (b) of FIG. 6. Using such a patterned substrate 510, crystals are regrown from the surfaces (i.e., upper and side surfaces) of the crystal growth seed regions 130.

As shown in portion (c) of FIG. 6, crystals grow laterally from the side surfaces of the crystal growth seed regions 130 to form laterally grown regions 320b, and crystal also grow vertically from the upper surface of the crystal growth seed regions 130 to form vertically grown regions 320a. If the crystals are allowed to further regrow, a flat regrown nitride semiconductor 320, and eventually, a hetero-nitride semiconductor substrate 600, can be obtained as shown portion (d) of in FIG. 6. According to the maskless Pendeo growth method, the mask is removed before the crystals start regrowing, no impurities will enter the crystals from a dielectric material such as $SiO_2$ or SiN. As a result, a regrown nitride semiconductor layer 320 of good quality can be obtained.

Portions (a) to (d) of FIG. 7 are cross-sectional views illustrating respective process steps of a lateral selective growth process by the ABLEG (air bridged lateral epitaxial growth) method.

First of all, as shown in portion (a) of FIG. 7, a striped patterned mask 120 is formed on the nitride semiconductor layer 110. The mask 120 has a plurality of elongate holes 200 which run in stripes. In the case of a nitride semiconductor to grow on an m-plane as a principal surface, the direction in which the striped portions of the mask 120 run is defined to be parallel to the a-axis.

Next, as shown in portion (b) of FIG. 7, striped recesses 211 are formed by etching on the surface of the nitride semiconductor layer 110 to form a patterned structure 131. In this process step, the etching process is not performed until the surface of the growing substrate 100 of m-plane sapphire gets exposed but is stopped halfway through the nitride semiconductor layer 110. The depth of the recesses 211 is set so as to check the regrowth of the nitride semiconductor layer from the recesses during the regrowth process. The maximum depth of the recesses 211 is determined by, and is set to be smaller than, the thickness of the nitride semiconductor layer. The depth of the recesses 211 may be set to be equal to or greater than 10 nm, e.g., 100 nm or more.

Subsequently, as shown in portion (c) of FIG. 7, a growth checking layer 121 of a dielectric material is formed over the entire surface of the patterned structure 131. The growth checking layer 121 may be formed of any material, e.g., a dielectric material such as $SiO_2$ or SiN as described above or any other material, as long as the growth checking layer 121 has the function of checking the regrowth of the nitride semiconductor.

Thereafter, as shown in portion (d) of FIG. 7, portions of the growth checking layer 121 which have been located on the projections of the patterned structure 131 are removed to obtain a patterned substrate 520. The striped top regions 132 of the patterned substrate 520 serve as crystal growth seed regions.

Next, crystals are regrown from the striped top regions 132 to obtain a regrown nitride semiconductor layer 330. If the regrown nitride semiconductor layer 330 is allowed to grow continuously, then the crystals that have grown from the respective top regions 132 will soon combine together to form junctions 420. However, these junctions 420 do not have to be formed and the crystals may not combine together. In this manner, a hetero-nitride semiconductor substrate 620 is obtained as shown in portion (e) of FIG. 7.

In this modified example, a patterned substrate 520 on which the crystal growth seed regions 130 run substantially parallel to the a-axis direction of the nitride semiconductor is also made. In the laterally grown regions 330b, the lattice relaxation has been further promoted and the crystallinity has been improved compared to the m-plane nitride semiconductor layer that has grown directly on the sapphire substrate.

The crystal lattice tilts more significantly in the laterally grown region 330b than in the vertically grown region 330a in which crystals have regrown right over the top regions 132. Supposing the relative crystal lattice tilt angle between these two regions is α, the tilt angle α can be controlled within the range of not less than 0 degrees and not more than 0.35 degrees. As can be seen, even with a different lateral growth method adopted, if the top regions 132 functioning as the crystal growth seed regions are formed and if crystals are regrown from that structure, then the regrown layer is less likely to be affected by the strain in the growing substrate or the nitride semiconductor layer. As a result, the lattice relaxation can be promoted and the crystallinity can be improved significantly.

Optionally, in this embodiment, the growing substrate 100 may be removed after that structure has been completed. That is to say, the final product may be a multilayer structure consisting of only nitride semiconductor layers (including the regrown nitride semiconductor 320 and the crystal growth seed regions 130), of which the principal surface is a non-polar plane and from which the growing substrate 100 has been removed. The growing substrate 100 may be removed by some technique such as polishing or laser lift-off.

(Embodiment 2)

FIG. 17 is a schematic view illustrating a light-emitting element which uses a non-polar plane hetero-nitride semiconductor substrate as described for the first embodiment. The non-polar plane hetero-nitride semiconductor substrate 600 is fabricated by the method that has already been described for the first embodiment.

The nitride semiconductor substrate 600 is comprised of the growing substrate 100 and a regrown nitride semiconductor layer 320 which has been formed on the substrate 100. The regrown nitride semiconductor layer 320 may be a layer including Al, In and B, and may be an AlN film, for example. In that case, in deep ultraviolet and ultraviolet light-emitting elements which cover the wavelength range of 200 nm to 365 nm, it is possible to prevent the light emitted from the active layer from being absorbed into the regrown nitride semiconductor layer 320 and avoid the problem of cracks, which is beneficial.

The regrown nitride semiconductor layer 320 does not have to consist of a single layer such as a GaN layer or an AlN layer but may include a single $Al_xGa_yIn_zN$ (where $0 \leq x \leq 1$, $0 < y \leq 1$, $0 \leq z \leq 1$ and $x+y+z=1$) layer, an alternate stack of $Al_xGa_yIn_zN$ (where $0 \leq x \leq 1$, $0 < y \leq 1$, $0 \leq z \leq 1$ and $x+y+z=1$) layers with mutually different compositions, or those layers to which element B has been further added.

The regrown nitride semiconductor layer 320 and crystal growth seed regions 130 may be layers which have gotten conductivity through doping. For example, the regrown nitride semiconductor layer 320 and crystal growth seed regions 130 may have gotten n-type conductivity by being doped with Si.

On the principal surface of the regrown nitride semiconductor layer 320, a semiconductor multilayer structure 30 is formed by epitaxial growth process, which may be an MOCVD (metal organic chemical vapor deposition) process. For example, on the principal surface of a non-polar plane hetero-nitride semiconductor substrate 600, an $Al_xGa_yIn_zN$ (where $0 \leq x \leq 1$, $0 < y \leq 1$, $0 \leq z \leq 1$ and $x+y+z=1$) layer is grown as the n-type layer 32. Silicon (Si) may be used as dopant to be introduced into the n-type layer 32 and silane ($SiH_4$) gas may be used as an Si source gas. The combined thickness of the regrown nitride semiconductor 320 and the n-type layer 32 may fall within the range of approximately 3 to 20 μm. The regrown nitride semiconductor 320 and the n-type layer 32 may be grown at a temperature of approximately 900 to 1500 degrees Celsius.

Next, an active layer 34 is grown on the n-type layer 32. The active layer 34 may be a multi-quantum well structure in which $Al_xGa_yIn_zN$ (where $0 \leq x \leq 1$, $0 < y \leq 1$, $0 \leq z \leq 1$ and $x+y+z=1$) well layers and $Al_xGa_yIn_zN$ (where $0 \leq x \leq 1$, $0 < y \leq 1$, $0 \leq z \leq 1$ and $x+y+z=1$) barrier layers have been stacked one upon the other alternately. Each of those well layers may have a thickness of 1 to 20 nm, and each of those barrier layers may have a thickness of 1 to 100 nm. The quantum well structure may have a cycle number of 1 to 20. The growth temperature may fall within the range of 700 to 1200 degrees Celsius. The composition of the active layer 34 may be determined so that the emission wavelength becomes an intended wavelength. Also, the composition of the active layer 34 is suitably controlled so that the bandgap energy of the active layer 34 becomes smaller than that of the n-type layer 32.

First of all, an undoped $Al_xGa_yIn_zN$ (where $0≤x≤1$, $0<y≤1$, $0≤z≤1$ and $x+y+z=1$) layer 36 is grown on the active layer 34. Next, a p-type layer 35 of p-type $Al_xGa_yIn_zN$ (where $0≤x$, y, $z≤1$ and $x+y+z=1$) is grown thereon. Magnesium (Mg) may be used as the p-type dopant and $Cp_2Mg$ (cyclopentadienyl magnesium) may be used as the source gas. The p-type layer 35 may have a thickness of 10 to 500 nm and may be grown at a temperature of 800 to 1400 degrees Celsius. In this manner, a nitride semiconductor multilayer structure 30 is formed.

Next, by partially removing the p-type layer 35, active layer 34 and n-type layer 32 by photolithography and dry etching techniques, a recess 39 is formed and the n-type layer 32 is partially exposed. In this process step, the recess 39 and an n-side electrode 38 are suitably located over the crystal growth seed region 130. The reason is that as the lattice strain has not been relaxed sufficiently in the nitride semiconductor over the crystal growth seed region 130, a part of the active layer 34 may be removed from that region. Alternatively, the recess 39 may also be cut through the junction between the laterally grown regions. The reason is that the junction between the laterally grown regions includes so many defects that a part of the active layer 34 may be removed from that region.

Subsequently, an n-side electrode 38 of aluminum (Al) with a thickness of 100 to 400 nm is formed on the exposed surface of the n-type layer 32.

Next, a p-side electrode 37 of silver (Ag) with a thickness of 100 to 400 nm is formed on the p-type layer 35. It should be noted that the n-side and p-side electrodes 38 and 37 could be formed in any order. In this manner, a nitride based semiconductor light-emitting element 10 is completed.

In the nitride based semiconductor light-emitting element 10 of this embodiment, the strain in the nitride semiconductor crystals has been reduced. Thus, a highly reliable light-emitting element is provided.

(Embodiment 3)

FIG. 18 is a schematic representation illustrating a white light source which uses the nitride based semiconductor light-emitting element that has been described for the second embodiment.

This light source includes a nitride-based semiconductor light-emitting element 1000 and a resin layer 2000 in which particles of a phosphor such as YAG (yttrium aluminum garnet) are dispersed to change the wavelength of the light emitted from the light-emitting element 1000 into a longer one. The light-emitting element 1000 is mounted on a supporting member 2200 on which a wiring pattern has been formed. And on the supporting member 220, a reflective member 2400 is arranged so as to surround the light-emitting element 1000. The resin layer 2000 has been formed so as to cover the light-emitting element 1000.

In the white light source of this embodiment, the strain in the nitride semiconductor crystals has been reduced. Thus, a highly reliable white light source is provided.

EXAMPLES

Example 1

Nitride Semiconductor Multilayer Structure With an L Width of 5 μm and an S Width of 50 μm Hereinafter, it will be described, as a first specific example of the present disclosure, how effectively the crystallinity can be improved by tilting the crystal lattice when a nitride semiconductor structure, of which the principal surface is an m-plane, is formed by lateral selective growth using the maskless Pendeo method, for example.

In this example, an m-plane sapphire wafer was used as the growing substrate 100 shown in portion (a) of FIG. 6. The m-plane sapphire wafer had a thickness of 430 μm and a diameter of approximately 5.1 cm (=2 inches). And the angle formed between a normal to the principal surface of the m-plane sapphire wafer and a normal to the m plane was 0±0.1 degrees.

(Cleaning m-Plane Sapphire Wafer)

The m-plane sapphire wafer was cleaned for 10 minutes with a cleaning fluid that had been heated to 100 degrees Celsius. The cleaning fluid was obtained by mixing sulfuric acid and phosphoric acid at a volume ratio of one to one. Subsequently, the m-plane sapphire wafer was washed with water.

(Doing Thermal Cleaning on Sapphire Wafer)

Next, the m-plane sapphire wafer was loaded into a metal organic chemical vapor deposition (MOCVD) system, in which hydrogen and nitrogen gases were used as carrier gases.

The m-plane sapphire wafer was rotated at a rotational velocity of 3 rpm.

Then the m-plane sapphire wafer was heated to a temperature of 1000 to 1100 degrees Celsius for minutes in the MOCVD system.

(Growing Buffer Layer 105)

After the heat treatment, the temperature of the wafer was lowered to 650 degrees Celsius, at which a buffer layer was grown.

The following Table 1 shows the condition for growing the buffer layer.

In this Example 1, an AlN buffer layer was used as the buffer layer. The AlN buffer layer was grown on the sapphire wafer by supplying trimethylaluminum (TMA) and ammonia gases.

The AlN buffer layer had a thickness of approximately 300 nm. Also, before the AlN buffer layer was grown, the surface of the sapphire wafer was exposed to only the TMA gas for 10 seconds.

The following Table 1 specifies the condition for growing the buffer layer according to this Example 1:

TABLE 1

| | |
|---|---|
| TMA flow rate | 15 μmol/min |
| Ammonia flow rate | 0.6 l/min |
| Before buffer layer was grown, TMA gas exposure time | 10 seconds |
| AlN buffer layer's growth rate | ≤13 nm/min |
| AlN buffer layer's growth process time | 16 minutes |
| Growth pressure | 13 kPa |
| TMA/ammonia supply ratio (molar ratio) | ≤1700 |

After the AlN buffer layer had been deposited, the temperature was raised to, and maintained for one minute at, approximately 970 degrees Celsius while the ammonia gas was supplied continuously.

Thereafter, trimethylgallium (TMG) and ammonia gases were supplied to deposit a nitride semiconductor layer 110 of GaN on the surface of the buffer layer. The following Table 2 specifies the condition for growing the nitride semiconductor layer:

TABLE 2

| | |
|---|---|
| TMG flow rate | 68 µmol/min |
| Ammonia flow rate | 4.0 l/min |
| GaN layer's growth rate | 1.5 to 2 µmm/hr |
| GaN layer's growth process time | 60 minutes |
| Growth pressure | 67 kPa |
| TMG/ammonia supply ratio (molar ratio) | about 2630 |

The GaN layer had a thickness of approximately 2 µm.

(Photolithographic Process)

Next, as shown in portion (a) of FIG. 6, a photoresist mask 120 was formed on the GaN layer by the known photolithographic method. In this example, a typical line and space (L & S) pattern, i.e., an elongate striped pattern, was used as the mask.

In this example, the mask shown in portion (a) of FIG. 6 was configured to have a constant width (L width) of 5 µm and the recess 210 was supposed to have a width of 50 µm. In this case, the width of the recess 210 substantially agrees with the spacing (S width) between adjacent crystal growth seed regions.

When the photolithographic process ended, the mask had a thickness of approximately 3 µm. By defining the masking pattern, the direction in which the crystal growth seed region 130 will run is determined. In this example, this direction is tilted by approximately 3 degrees in the c-axis direction within the plane with respect to the a-axis direction of the nitride semiconductor. The present inventors discovered that by tilting the crystal growth seed regions within the m-plane as the principal surface in this manner, the lateral growth rate could be increased and the resultant nitride semiconductor layer could be flattened more easily.

(Etching Process)

Next, using an inductively coupled plasma (ICP) etching system, the GaN layer that had been grown directly on the sapphire wafer was etched through the mask. The etching process was conducted using a chlorine based gas.

By performing this process step, the sapphire wafer was selectively exposed. In this manner, crystal growth seed regions 130 to be projections were formed and recesses 210 were formed between those regions. The upper part of the sapphire wafer was etched away so as to prevent portions of the GaN layer from being left when the recesses 210 were formed by etching.

After that, the mask was removed from the crystal growth seed regions to obtain the patterned substrate 510 shown in portion (b) of FIG. 5.

(Re-Growing Nitride Semiconductor Layer 320)

Next, a nitride semiconductor layer 320 of GaN was regrown on the patterned substrate 510. For that purpose, the patterned substrate 510 was loaded into the metal organic chemical vapor deposition system again, and then a regrowth process was carried out with the regrowth temperature set to be approximately 950 degrees Celsius.

The following Table 3 specifies a detailed condition for forming the regrown nitride semiconductor 320:

TABLE 3

| | |
|---|---|
| TMG flow rate | 136 µmol/min |
| Ammonia flow rate | 3 l/min |

TABLE 3-continued

| | |
|---|---|
| Regrown GaN layer's growth rate | 3 to 4 µmm/hr |
| Regrown GaN layer's growth process time | 90 minutes |
| Growth pressure | 67 kPa |
| TMG/ammonia supply ratio (molar ratio) | about 980 |

In this example, a hetero-nitride semiconductor substrate 600, of which the principal surface was an m-plane, was obtained by setting the growth process time to be 3 hours and by depositing a regrown GaN layer to a thickness of approximately 5 to 6 µm.

Example 2

Nitride Semiconductor Multilayer Structure With an L Width of 5 µm and an S Width of 100 µm Experiments were carried out in quite the same way as in Example 1 except that the S width was changed from 50 µm into 100 µm.

Comparative Example 1 m-Plane GaN Single-Film Layer on m-Plane Sapphire Wafer

A nitride semiconductor layer 110 of GaN was formed in the same way as in Example 1.

A nitride semiconductor layer 320 of GaN was regrown on a GaN layer without performing a photolithographic process or an etching process (i.e., without forming crystal growth seed regions 130). The regrown GaN layer thus formed was a single GaN film and included no laterally grown regions at all.

Comparative Example 2

Nitride Semiconductor Multilayer Structure with an L Width of 5 µm and an S Width of 10 µm Experiments were carried out in the same way as in Example 1 except that the S width was changed from 50 µm into 10 µm.

(Evaluation Result: Surface Morphology of Example 1)

FIG. 8 is a micrograph of a hetero-nitride semiconductor substrate according to Example 1 as viewed from over its surface (i.e., in the m-axis direction). It can be seen that striped regrown nitride semiconductor structure 320 was formed in the a-axis direction of GaN. The striped structure had a width of approximately 15 µm. That is to say, the present inventors confirmed that a GaN film was regrown to a thickness of 5 µm in each of ±c-axis directions, because the L width was 5 µm.

In the structure of this example, the nitride semiconductor layers 320 that had regrown from respective crystal growth seed regions 130 did not combine together and the surface of the underlying sapphire substrate was exposed. However, the regrown nitride semiconductor layers 320 could be combined together and a flat film that would make the surface of the sapphire substrate invisible could be formed by optimizing the S width with the regrowth process time extended as will be described later for Example 4.

Portions (a) to (c) of FIG. 9 show the surface morphologies of other examples for the purpose of comparison. Portion (a) of FIG. 9 shows the results obtained in Comparative Example 2 in which the S width was set to be 10 µm. Portion (b) of FIG. 9 shows the results obtained in Example 1 in which the S width was set to be 50 μm. And portion (c) of FIG. 9 shows the results obtained in Example 2 in which the S width was set to be 100 μm. In each of these samples, the laterally grown regions that had regrown from multiple crystal growth seed regions 130 did not combine together.

(Evaluation Result: Comparison of X-Ray Rocking Curve Half Widths of Symmetrical Planes)

Next, the degree of crystallinity of Example 1 was evaluated through X-ray diffraction measurement. Specifically, the degree of crystallinity was evaluated by the half width of the X-ray omega rocking curve (XRC) of a (10-10) plane, which is the symmetrical plane of m-plane GaN.

The X-ray diffraction measurement was carried out using SLX-2000 (produced by Rigaku Corporation). As the X-ray source, a rotating anticathode X-ray tube, of which the anti-cathode was formed of Cu, was used. And the focus of the X-ray was supposed to be a line focus. The tube was driven with a voltage of 50 kV and a current of 250 mA. As for optical systems, a dielectric multilayer mirror and a dual-crystal optical system of Ge (220) were used on the light incoming end and an open slit was used on the light receiving end.

Since an XRC measurement should be carried out, the 2 θ angle was fixed at 32.416 degrees, which is the angle of diffraction of a (10-10) plane of GaN, and indexing and scanning were carried out at a ω angle of around 16.208 degrees. In this manner, a rocking curve measurement was carried out on a peak of diffraction and the XRC full width at half maximum was evaluated. The X-ray incoming direction was supposed to be parallel to the a-axis of GaN.

The following Table 4 shows the result of measurement of the XRC full width at half maximum. The result obtained from the m-plane single GaN film that had been grown on an m-plane sapphire substrate as Comparative Example 1 is also shown for the purpose of comparison:

TABLE 4

| | XRC full width at half maximum |
|---|---|
| Comparative Example 1 | 835 seconds |
| Example 1 | 473 seconds |

The half width of the m-plane GaN layer which had been grown directly on the m-plane sapphire substrate in Comparative Example 1 was as high as 800 seconds, which indicates that a film that had been grown directly without adopting the lateral selective growth had a high dislocation density and poor crystallinity.

On the other hand, if m-plane GaN had been regrown as in Example 1 after the patterned substrate 510 had been formed, the XRC full width at half maximum decreased to the order of 400 seconds. Thus, the present inventors confirmed that the dislocation density could be reduced and the crystallinity could be improved significantly by adopting the maskless Pendeo growth of this example.

As can be seen, the effect of improving the crystallinity significantly by the lateral selective growth was confirmed by measuring the XRC full width at half maximum.

(Evaluation Result: Evaluation of Crystal Lattice's Tilt By Reciprocal Lattice Mapping)

Next, the tilt of the crystal lattice of Example 1 was evaluated.

The tilt of a crystal lattice can be evaluated easily by reciprocal lattice mapping using the X-ray diffraction method.

The reciprocal lattice mapping was carried out using SLX-2000 (produced by Rigaku Corporation). As the X-ray source, a rotating anticathode X-ray tube, of which the anti-cathode was made of Cu, was used. And the focus of the X-ray was supposed to be a line focus. The tube was driven with a voltage of 50 kV and a current of 250 mA. As for optical systems, a dielectric multilayer mirror and a dual-crystal optical system of Ge (220) were used on the light incoming end and a quarter slit was used on the light receiving end.

In the reciprocal lattice mapping measurement, the (30-30) plane diffraction of m-plane sapphire and the (20-20) plane diffraction of m-plane GaN were compared to each other to evaluate the tilt of the crystal lattice of the GaN layer with an origin set on the sapphire substrate.

The angles of diffraction of the (30-30) plane of m-plane sapphire and the (20-20) plane of m-plane GaN were 2θ 68.295 degrees and 2θ 67.866 degrees, respectively, which are relatively close to each other. That is why by making measurements on these two points of diffraction at the same time, the relative percentages of strain of sapphire and GaN, and eventually the tilt of the crystal lattice, can be evaluated.

In making the measurements, an offset angle was set for the ω angle so as to detect the diffraction of the sapphire (30-30) plane and the GaN (20-20) plane and 2θ-ω was measured a number of times with the offset angle varied (i.e., by Δω) to carry out the reciprocal lattice mapping measurement.

When this measurement was carried out, the X-ray incoming directions were set to be the c-axis and a-axis directions of GaN. That is to say, the reciprocal lattice mapping measurement was carried out with the ω angle offset direction changed into the c-axis and a-axis directions, respectively.

By making these measurements, the tilt of the crystal lattice can be evaluated in each of the c-axis and a-axis directions of GaN.

FIGS. 10A to 10C show the results of the reciprocal lattice mapping measurement that was carried out on a sample with an L width of 5 μm and an S width of 50 μm according to Example 1.

FIG. 10A is a schematic representation illustrating the structure of the sample as viewed from over its surface and showing the direction in which the crystal growth seed regions 130 grew and the direction from which the X-ray came. The crystal growth seed regions 130 were formed in stripes substantially parallel to the a-axis direction of GaN. FIG. 10B shows the results of the reciprocal lattice mapping measurement in a situation where an X-ray was incident parallel to the c-axis of GaN. On the other hand, FIG. 10C shows the results of the reciprocal lattice mapping measurement in a situation where an X-ray was incident parallel to the a-axis of GaN. The reciprocal lattice mapping data was obtained by making measurement around a peak of diffraction of an m-plane that is the principal surface in the vicinity of the (3-300) plane of the m-plane sapphire substrate and the (2-200) plane of m-plane GaN.

The results of the reciprocal lattice mapping measurement will be described with reference to FIGS. 11A and 11B. These results of the reciprocal lattice mapping are obtained by performing a coordinate transformation on the results of Δω and 2θ-ω measurements thus obtained into Qx and Qy that are the spatial axes of the reciprocal lattice. In the reciprocal lattice mapping measurement, the unit of the coordinates Qy and abscissas Qx is the inverse number of the lattice constant. As shown in FIG. 11A, if the crystal lattice does not tilt between the growing substrate and the growing layer, there is no difference between the respective peak Qx values of sapphire and GaN. On the other hand, if the crystal lattice does tilt in the GaN layer, there is a difference between the respective peak Qx values of sapphire and GaN as shown in FIG. 11B. As can be seen from FIG. 11B, the tilt angle β satisfies tan β=Qx/Qy.

According to the results of the reciprocal lattice mapping measurement shown in FIG. 10B, when an X-ray was incident in the c-axis direction of GaN, the respective peak Qx values of sapphire and GaN were almost equal to each other, which indicates that the tilt of the crystal lattice as viewed in this direction was almost zero. That is to say, the present inventors discovered that the m-axis of GaN was hardly tilted in the c-axis direction.

On the other hand, the results shown in FIG. 10C revealed that sapphire and GaN had quite different Qx values. This means that since the X-ray was incident in the a-axis direction of GaN, the m-axis of GaN was tilted in the a-axis direction of GaN with respect to the m-axis of sapphire as the growing substrate. At the peak of GaN, the Qx value was 9E-3 (1/Å) and the Qy value was 0.724 (1/Å). That is to say, the tilt angle of the crystal lattice of Example 1 was estimated to be approximately 0.69 degrees.

As can be seen, in a non-polar-plane nitride semiconductor, the crystal lattice will tilt in a particular direction due to the asymmetry of the crystal axis in the growing plane. In the case of GaN, of which the principal surface is an m-plane, lattice constants in its growing plane are defined in the a-axis direction and in the c-axis direction. In this case, GaN has an a-axis lattice constant of 0.3189 nm and a c-axis lattice constant of 0.5185 nm, which are significantly different from each other. That is why the decrease in strain and the lattice relaxation process also become asymmetric within the plane. And in a nitride semiconductor, of which the principal surface is an m-plane, dislocation lines are easily formed parallel to the c-axis. In that case, misfit dislocations with dislocation lines extending in the c-axis direction would be generated easily at the interface but dislocations with dislocation lines extending in the a-axis direction that intersects with the c-axis direction at right angles would not be generated easily due to the lattice relaxation.

According to the results shown in FIGS. 10A to 10C, the tilt of the crystal lattice would have been observed only when the X-ray was incident in the a-axis direction, because dislocation lines were formed asymmetrically only in the c-axis direction.

Thus, the present inventors discovered that in the maskless Pendeo grown sample (with an S width of 50 μm) according to Example 1, there was a significant crystal lattice tilt of 0.69 degrees. The present inventors also confirmed that this tilt angle of the crystal lattice was not observed when the X-ray was incident in the c-axis direction of the nitride semiconductor but was observed only when the X-ray was incident in the a-axis direction.

(Evaluation Result: Comparative Example 1)

To make a comparative evaluation of the crystal lattice's tilt value that was observed in Example 1, the results obtained for Comparative Example 1, which is a single GaN film with no laterally grown regions, will be described.

FIG. 12 shows the result of the reciprocal lattice mapping measurement that was carried out on Comparative Example 1. Only the results that were obtained by making the X-ray incident in the a-axis direction of GaN are shown in FIG. 12. On the other hand, when the X-ray was incident in the c-axis direction of GaN, no tilt of the crystal lattice was observed as already described for Example 1.

As shown in FIG. 12, the present inventors discovered that even in Comparative Example 1 in which no lateral selective growth was carried out, the peak Qx value of GaN also shifted from the peak Qx value of the sapphire substrate.

That is to say, the present inventors confirmed that the crystal axis also tilted in Comparative Example 1, too.

According to the results shown in FIG. 12, the tilt angle of the crystal lattice was estimated to be approximately 0.34 degrees.

These results were obtained probably because lattice relaxation would have been caused according to the degree of lattice mismatch at the interface between sapphire and the GaN layer and the crystal lattice would have tilted there. That is to say, as long as sapphire and GaN have mutually different lattice constants or crystal structures and as long as there is in-plane crystal axis anisotropy that is peculiar to a non-polar plane, such tilt of the crystal lattice should be observed quite a little.

In this example, the dislocation lines of the misfit dislocation due to the lattice relaxation are formed easily in the c-axis direction but are not formed easily in the a-axis direction. That is why such a tilt of the crystal lattice is unique to a non-polar-plane nitride semiconductor and would never be seen in any conventional c-plane nitride semiconductor with a sufficient degree of symmetry.

In Comparative Example 1, the tilt value of the crystal lattice was as small as a half or less of that of Example 1.

As described above, if m-plane GaN is supposed to grow in the DME mode on an m-plane sapphire substrate and if the lattice strain has been relaxed completely, the crystal lattice will have a tilt angle of 0.89 degrees.

That is to say, it can be seen that in both of the single film growth in Comparative Example 1 and the selective growth in Example 1, the crystal lattice had a tilt angle of less than 0.89 degrees and there was some residual strain.

Also, such strain could vary according to the growth condition.

Example 1 and Comparative Example 1 adopted quite the same condition such as the growth process time except that the etching process was carried out in Example 1 to produce the lateral selective growth.

It turned out that even though the growth process had been performed under almost the same condition, the tilt of the crystal lattice was substantially doubled in Example 1 compared to the single film structure and the lattice relaxation was promoted.

And such promotion of the lattice relaxation would have contributed effectively to improving the crystallinity significantly as shown in Table 4.

That is to say, the present inventors discovered that by carrying out the lateral selective growth with the S width increased as in Example 1, the tilt angle of the crystal lattice could be increased, the strain reducing effect could be promoted, and eventually, the degree of crystallinity could be increased significantly.

The present inventors carried out experiments to find specifically in what ranges the S width and the crystal lattice tilt angle should fall to achieve such lattice relaxation (or strain reduction) promoting effect and the crystallinity improving effect. The results are as follows.

(Evaluation Result: S Width Dependence)

Based on the results of Example 1 described above, X-ray reciprocal lattice mapping measurements were carried out in Example 2, Comparative Example 2 and Comparative Example 1 with the S width changed. And the results thus obtained were compared to each other to make an evaluation.

Portions (a), (b), (c) and (d) of FIG. 13 show the results of the reciprocal lattice mapping measurements that were carried out in Comparative Example 1, Comparative Example 2 (at an S width of 10 μm), Example 1 (at an S width of 50 μm) and Example 2 (at an S width of 100 μm), respectively. The X-ray was supposed to be incident in the a-axis direction of GaN. Although no results are shown for the c-axis direction, no tilt of the crystal lattice was observed.

The results obtained in Comparative Example 1 as shown in portion (a) of FIG. 13 are the same as the ones shown in FIG. 12. Thus, the crystal lattice tilt angle was also estimated to be approximately 0.34 degrees.

Next, if the S width was 10 μm as in Comparative Example 2 shown in portion (b) of FIG. 13, the crystal lattice had a tilt angle of approximately 0.31 degrees, which was not significantly different from that of Comparative Example 1. That is to say, it turned out that if the S width was 10 μm as in Comparative Example 2, the crystal lattice tilt angle and the degree of lattice relaxation were almost the same as in the single film growth of Comparative Example 1.

These results reveal that if the S width was approximately 10 μm when m-plane GaN was grown laterally and selectively, the crystal lattice's tilt angle was not significantly different from that of the single-film structure and the crystal lattice relaxation and strain reduction were not promoted.

On the other hand, as shown in portions (c) and (d) of FIG. 13, as the S width was increased to 50 μm in Example 1 and then to 100 μm in Example 2, the crystal lattice's tilt angle increased steeply and estimated to be 0.69 degrees in both of these two examples.

That is to say, the present inventors discovered that by setting the S width to be greater than 10 μm, the lattice relaxation could be promoted and the crystal lattice's tilt angle could be almost doubled.

Furthermore, the crystal lattice's tilt angles were not significantly different from, but substantially equal to, each other in Examples 1 and 2.

Furthermore, the length of the laterally grown region as measured in the c-axis direction was approximately 15 μm in Example 1 and approximately 30 μm in Example 2 (see portions (b) and (c) of FIG. 9). Even though the length of the laterally grown region as measured in the c-axis direction in Example 2 was almost twice as large as that of Example 1, there was no significant difference in crystal lattice's tilt angle between Examples 1 and 2. These results reveal that the increase in the tilt angle of the crystal lattice does not depend on the c-axis length of the laterally grown region. Furthermore, the tilt angle of the crystal lattice is not proportional to the S width but starts to increase steeply at a certain S width. Based on these results of measurements, the present inventors confirmed that the tilt of the crystal lattice could be promoted effectively when the S width was within the range of more than 10 pm and not less than 50 μm.

In conclusion, these results are summarized as follows:

(1) With the laterally and selectively grown structure of this example, the lattice relaxation can be promoted and the degree of crystallinity can be improved. To achieve these effects, however, it is important to control the S width. When the S width fell within the range of 50 μm or more, the tilt angle of the crystal lattice turned out to be approximately twice or more as large as in a single-film sample or a sample with a small S width; and (2) Judging from the S width dependence of the crystal lattice's tilt angle, the tilt angle of the crystal lattice actually does not depend on the S width, but the effect of promoting the lattice relaxation (or strain reduction) could be achieved at or over a certain S width setting.

(Evaluation Result: Relation Between Crystal Lattice's Tilt Angle and Crystallinity)

The following Table 5 summarizes the relation between the crystal lattice's tilt angle and the degree of crystallinity that was obtained based on the results shown in portions (a) to (d) of FIG. 13:

TABLE 5

| | Crystal lattice's tilt angle β (deg) with respect to m-axis of sapphire | Crystal lattice's tilt angle β (deg) | XRC full width at half maximum (arcsec): incident in a-axis direction | Residual strain $\epsilon eff$ (%) |
| --- | --- | --- | --- | --- |
| Comparative Example 1 (single GaN film) | 0.34 (β1) | — | 835 | 1.12 |
| Comparative Example 2 (S width: 10 μm) | 0.31 (β2) | −0.03 | 553 | 1.18 |
| Example 1 (S width: 50 μm) | 0.69 (β2) | 0.35 | 473 | 0.41 |
| Example 2 (S width: 100 μm) | 0.69 (β2) | 0.35 | 465 | 0.41 |

Since the crystal growth seed region is obtained by patterning a single GaN film, the angle defined by the m-axis of the crystal growth seed region with respect to the m-axis of sapphire would be equal to the angle defined by the m-axis of the single GaN film to the m-axis of sapphire. That is to say, in the results shown in this Table 5, the tilt angle β of the crystal lattice with respect to the m-axis of sapphire in Comparative Example 1 corresponds to β1 shown in FIGS. 4A and 4B.

The nitride semiconductor layer in the vertically grown region 320a inherits the high-density dislocations in the underlying crystal growth seed region 130 as they are, and therefore, comes to have a low degree of crystallinity and a low diffraction peak intensity in the XRC measurement. That is why the peak of diffraction of the nitride semiconductor layer 320 obtained by the reciprocal lattice mapping as already described with reference to portions (a) to (d) of FIG. 13 would mirror a lot of information about the laterally grown region 320b with a high degree of crystallinity and a high diffraction peak intensity. That is to say, in the results shown in Table 5, the tilt angles β of the crystal lattice with respect to the m-axis of sapphire in Comparative Example 2 and Examples 1 and 2 corresponds to β2 shown in FIGS. 4A and 4B.

In the results shown in Table 5, the tilt angle α of the crystal lattice is the angle defined by the respective m axes of the crystal growth seed region and laterally grown region with respect to the a-axis direction of GaN and is obtained by calculating β2-β1.

Also, in the results shown in Table 5, the XRC full width at half maximum is the half width of a rocking curve representing a peak of diffraction to be measured by making an X-ray incident in the a-axis direction of GaN. The smaller the XRC full width at half maximum is, the better the crystallinity of GaN should be.

Furthermore, in the results shown in Table 5, the residual strain $\epsilon eff$ is the percentage of strain of GaN to be calculated by Equation (4). In this case, calculations were made on the supposition that an ideal percentage of strain of 1.8% should be obtained when crystals grow in the DME mode. The strain estimated based on the crystal lattice's tilt angle that had been obtained by measurement turned out to be relatively large in the single GaN film of Comparative Example 1 and in Comparative Example 2 in which the S width was as narrow as 10 μm. That is to say, in those cases, the lattice relaxation was insufficient and there was a residual strain of 1.1% or more. On the other hand, in Examples 1 and 2 in which the S width was large, the percentage of strain could be reduced to 0.41%.

That is to say, by increasing the crystal lattice's tilt angle β2 with respect to the m-axis of sapphire to 0.69 degrees, the strain of the GaN layer could be reduced significantly to approximately one third. And it turned out that the degree of crystallinity could be improved eventually.

The degree of crystallinity could be improved in Comparative Examples 1 and 2 because the dislocation density had been reduced by the selective growth. In those case, the strain of the crystals could not be reduced.

On the other hand, in Examples 1 and 2 in which the S width was equal to or greater than 50 μm, not just could the degree of crystallinity be improved but also could the lattice relaxation (strain reduction) be promoted by the lateral growth as well. Consequently, the residual strain in the crystals could be reduced significantly. On top of that, compared to Comparative Example 2, the XRC full width at half maximum could be further reduced by approximately 100 seconds in Examples 1 and 2.

FIG. 14 shows how the XRC full width at half maximum changed with the crystal lattice's tilt angle α. If α was increased, the XRC full width at half maximum could be reduced.

Such a crystallinity improving effect is closely correlated to the crystal lattice's tilt angle α. If the relative tilt angle α of the crystal lattice was 0.35 degrees, the XRC full width at half maximum could be reduced to the order of 400 seconds and the degree of crystallinity could be improved. That is to say, the present inventors discovered that it is important to set the crystal lattice's tilt angle α to be larger than zero degrees and also discovered that the crystal lattice's tilt angle α should be close to 0.35 degrees.

Example 3

When the maskless Pendeo lateral regrowth is adopted, the tilt angle of the crystal lattice of m-plane GaN should increase in a sample with a large S width in a nitride semiconductor that has regrown laterally from the crystal growth seed region 130 (i.e., in the laterally grown region 320b shown in portions (a) to (d) of FIG. 6) preferentially.

The nitride semiconductor that has regrown vertically from the upper surface of the crystal growth seed region 130 (i.e., the vertically grown region 320a) should easily inherit the crystal structure of the underlying nitride semiconductor film 110 as it is. That is why the tilt of the crystal lattice should be almost the same as the single film (i.e., Comparative Example 1).

On the other hand, the nitride semiconductor 320b that has regrown mostly laterally from the crystal growth seed region 130 has so large a degree of freedom that the tilt of the crystal lattice should be promoted and the strain should be reduced.

In this example, these effects were confirmed by carrying out an X-ray diffraction analysis on a micro-region.

Structure of Example 3

In this example, a sample was made in the same procedure as in Example 1 except that the S width was set to be 20 μm. In this embodiment, a GaN layer was regrown under not only the condition shown in Table 3 but also the condition shown in the following Table 6:

TABLE 6

| TMG flow rate | 136 μmol/min |
|---|---|
| Ammonia flow rate | 0.5 l/min |
| GaN layer's growth rate | 3 to 4 μmm/hr |
| GaN layer's growth process time | 90 minutes |
| Growth pressure | 13 kPa |
| TMG/ammonia supply ratio (molar ratio) | about 160 |

(Evaluation Result: X-Ray Diffraction Analysis on Micro-Region)

In this example, a micro-region X-ray diffraction analysis was carried out on an m-plane GaN film which had been regrown by the Pendeo growing method to have an S width of 20 μm on an m-plane sapphire substrate to compare the respective X-ray diffraction peaks of the vertically grown region 320a and laterally grown region 320b to each other.

FIG. 15 is a micrograph of a sample according to this example as viewed from over its surface. In FIG. 15, shown are the vertically grown regions 320a, laterally grown regions 320b and junctions 410. Even though only some of them are shown in FIG. 15, these vertically grown regions 320a, laterally grown regions 320b and junctions 410 are arranged periodically in the c-axis direction of GaN.

The present inventors discovered that according to this Example 4, no gaps were seen between nitride semiconductor films 320 that had regrown from a plurality of crystal growth seed regions 130 and those regrown films were combined together almost completely to form a highly flat regrown film, compared to the sample of Example 1 shown in FIG. 8. This result was obtained because the regrowth process was continued for 90 more minutes under the condition of Example 1.

In this example, an X-ray diffraction analysis was carried out on a micro-region of this sample to estimate a difference in the crystal lattice's tilt between the vertically grown region 320a and laterally grown region 320b of the regrown nitride semiconductor layer 320. The X-ray diffraction analysis was carried out on the micro-region using Spring 8 Beam Line (BL13XU). The beam spot size Φ was set to be 1 μm or less. The condition was set so that the crystal lattice's tilt of the sample structure according to this example (in which the L width was set to be 5 μm and the S width was set to be 20 μm) could be estimated sufficiently accurately.

The X-ray had a wavelength of 8 keV (0.154 nm). The beam was made to be incident parallel to the a-axis direction of GaN. And the measurement was made with the spot of measurement moved in the c-axis direction of GaN.

The results of the micro-region X-ray diffraction analysis on the samples of this example are shown in FIG. 16. The micro-regions that were actually subjected to the measurement are indicated by A through F, of which the specific locations are shown in FIG. 15.

Specifically, A and B indicate the laterally grown region 320b, C and D indicate the vertically grown region 320a, and E and F indicate the laterally grown region 320b opposite from the one indicated by A and B.

Also, the results of measurement shown in FIG. 16 are the spectra of the ω rocking curves at the respective points shown in FIG. 15. Each of the ω rocking curves was obtained by evaluating a peak of a (2-200) plane of m-plane GaN. It can be seen that the diffraction peaks of the ω rocking curves of a (2-200) plane of GaN shown in FIG. 16 change their positions and shapes according to the locations A through F. Furthermore, the spectra of the ω rocking curves shown in FIG. 16 were all measured with the diffraction peak position of a (30-30) plane of m-plane sapphire set to be the origin. That is why the peak positions of the ω rocking curve spectra of m-plane GaN that were measured at the respective points A through F can be compared to each other to make an evaluation.

First, the diffraction peak of the vertically grown region 320a indicated by C and D will be described.

It can be seen that the diffraction peak of the vertically grown region 320a indicated by C and D was certainly a single peak but had a lower peak intensity and was located in a smaller angle range overall, compared to the diffraction peaks of the laterally grown regions 320b.

The vertically grown region 320a easily inherits the crystallinity of the underlying nitride semiconductor layer 110, i.e., the crystal growth seed region 130.

The nitride semiconductor layer 110 and the crystal growth seed region 130 are a single film yet to be subjected to the lateral selective growth and had a high dislocation density and a low degree of crystallinity. That is why their ω rocking curve spectra were broad and had a low diffraction intensity.

On the other hand, the diffraction peaks of the laterally grown regions 320b indicated by A, B, E and F had relatively high diffraction intensity and were double peaks.

That is to say, these results reveal that there was a shift in plane orientation, i.e., a region with a tilted crystal lattice, in the laterally grown regions 320b.

As can be easily expected from the results of Comparative Example 1, in the vertically grown region 320a indicated by C and D, the crystal lattice would have tilted due to a lattice mismatch between the m-plane sapphire substrate and the m-plane GaN layer. That is to say, the diffraction peak indicated by C and D would represent the crystal lattice's tilt angle β1 when described with reference to portions (a) to (e) of FIG. 7.

On the other hand, at each of the points A, B, E and F indicating the diffraction peaks of the laterally grown regions 320b, there was a second diffraction peak in a larger angle range, compared to the points C and D.

That is to say, this peak in the larger angle range would represent the crystal lattice's tilt angle β2 shown in portions (a) to (d) of FIG. 6. And the crystal lattice would have tilted to such a greater angle β2 than in the vertically grown region 320a, because the strain reduction and lattice relaxation would have been promoted by the lateral selective growth.

Based on these results of experiment of Example 3, the present inventors discovered and confirmed that (1) when the S width was 10 μm in Comparative Example 2, the crystal lattice tilted to almost the same degree as in Comparative Example 1 but when the S width was 20 μm in Example 3, the crystal lattice's tilt had been promoted; and (2) the crystal lattice's tilt would not have been promoted in the vertically grown region 320a considering the results obtained in Example 3 but the effect of promoting the crystal lattice's tilt was achieved significantly in the laterally grown regions 320b.

The results of Example 3 were obtained because the tilt of the crystal lattice was promoted by the lateral selective growth method. That effect was enhanced in a range where the S width was equal to or greater than 20 μm and was achieved more significantly when the S width was equal to or greater than 50 μm. The tilt of the crystal lattice means that the lattice relaxation had been caused. Consequently, a non-polar-plane nitride semiconductor layer with little strain and good crystallinity was realized.

The nitride semiconductor structure of the present disclosure has had its crystallinity improved greatly enough to be applied to an AlInGaN based semiconductor light-emitting element such as a light-emitting diode or a laser diode. Such a light-emitting element is expected to be applied to the fields of display, illumination and optical information processing and can also be used as an electronic device, too.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A nitride semiconductor structure comprising:
a plurality of crystal growth seed regions formed of a nitride semiconductor, of which the principal surface is an m-plane and which extends to a range that defines an angle of not less than 0 degrees and not more than 10 degrees with respect to an a-axis, wherein an S width that is the spacing between adjacent ones of the plurality of crystal growth seed regions is at least 50 μm; and
a regrown nitride semiconductor layer including vertically grown regions in which crystals have grown upward from the plurality of the crystal growth seed regions and laterally grown regions in which crystals have grown laterally from the plurality of the crystal growth seed regions;
wherein
the laterally grown regions are formed of a nitride semiconductor which has extended in a c-axis direction from each of the plurality of crystal growth seed regions; and
a following mathematical requirement is satisfied:
$0 < \alpha \leq 0.35$
where
$\alpha = \beta 2 - \beta 1$
β2 represents a tilt angle of an m-axis of the laterally grown regions in the a-axis direction thereof with respect to a normal line of the principal surface of the plurality of the crystal growth seed regions; and
β1 represents a tilt angle of an m-axis of the vertically grown regions in the a-axis direction thereof with respect to the normal line of the principal surface of the plurality of the crystal growth seed regions.

2. The nitride semiconductor structure of claim 1, wherein the S width that is the spacing between adjacent ones of the plurality of crystal growth seed regions is 100 μm or less.

3. The nitride semiconductor structure according to claim 1, further comprising:
a sapphire substrate having a principal surface that is an m-plane;
wherein
the plurality of crystal growth seed regions are grown on the sapphire substrate; and
an m-axis of the sapphire substrate accords with the normal line of the principal surface of the plurality of the crystal growth seed regions.

4. The nitride semiconductor structure of claim 3, wherein the S width that is the spacing between adjacent ones of the plurality of crystal growth seed regions is 100 μm or less.

5. The nitride semiconductor structure of claim 1, wherein each of the plurality of crystal growth seed regions comprises an upper surface from which the crystals of the vertically grown regions have grown upward, and side surfaces from which the crystals of the laterally grown regions have grown laterally.

* * * * *